United States Patent
Shi et al.

(10) Patent No.: US 12,364,013 B2
(45) Date of Patent: Jul. 15, 2025

(54) DISPLAY SUBSTRATE, METHOD FOR MANUFACTURING SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ling Shi, Beijing (CN); Yipeng Chen, Beijing (CN); Ke Liu, Beijing (CN); Fei Fang, Beijing (CN); Zhenhua Zhang, Beijing (CN); Xuewei Tian, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/650,445

(22) Filed: Apr. 30, 2024

(65) Prior Publication Data
US 2024/0282781 A1    Aug. 22, 2024

Related U.S. Application Data

(63) Continuation of application No. 17/604,971, filed as application No. PCT/CN2020/136098 on Dec. 14, 2020, now Pat. No. 12,002,817.

(51) Int. Cl.
*H10D 86/40*   (2025.01)
*H10D 86/01*   (2025.01)
(Continued)

(52) U.S. Cl.
CPC ......... *H10D 86/441* (2025.01); *H10D 86/021* (2025.01); *H10D 86/60* (2025.01); *H10K 59/131* (2023.02)

(58) Field of Classification Search
CPC .... H10D 86/441; H10D 86/021; H10D 86/60; H10K 59/131
See application file for complete search history.

(56) References Cited

U.S. PATENT DOCUMENTS

| 11,751,463 B2* | 9/2023 | Choi | H10K 59/123 |
| | | | 257/40 |
| 12,002,817 B2* | 6/2024 | Shi | H10K 59/131 |

(Continued)

FOREIGN PATENT DOCUMENTS

| CN | 111028765 A | 4/2020 |
| CN | 111312796 A | 6/2020 |

(Continued)

OTHER PUBLICATIONS

International search report of PCT/CN2020/136098 issued on Sep. 13, 2021.

(Continued)

*Primary Examiner* — J. E. Schoenholtz
(74) *Attorney, Agent, or Firm* — Lippes Mathias LLP

(57) ABSTRACT

Provided is a display substrate. The display substrate includes including a base substrate having a first display region and a second display region; in the pixel circuit included in the pixels in the second display region, the conductive line connected to the metal layer is a transparent conductive line, and the transparent conductive line is disposed between the two existing insulating layers.

20 Claims, 16 Drawing Sheets

(51) Int. Cl.
  *H10D 86/60* (2025.01)
  *H10K 59/131* (2023.01)

(56) References Cited

U.S. PATENT DOCUMENTS

| | | |
|---|---|---|
| 12,230,641 B2 * | 2/2025 | Huang .................. H10D 86/60 |
| 2017/0077188 A1 | 3/2017 | Kang et al. |
| 2020/0251539 A1 | 8/2020 | Fu |
| 2021/0202535 A1 | 7/2021 | Sun et al. |
| 2021/0208633 A1 | 7/2021 | Ma et al. |
| 2021/0408200 A1 * | 12/2021 | Zhao .................. H10K 59/121 |
| 2022/0115573 A1 * | 4/2022 | Huang ................ H01L 25/0753 |
| 2022/0310742 A1 * | 9/2022 | Yi ........................ G09G 3/3266 |
| 2022/0399374 A1 | 12/2022 | Shi et al. |

FOREIGN PATENT DOCUMENTS

| | | |
|---|---|---|
| CN | 111405084 A | 7/2020 |
| CN | 111725287 A | 9/2020 |
| CN | 211789021 U | 10/2020 |

OTHER PUBLICATIONS

Notice of allowance of U.S. Appl. No. 17/604,971 issued on Feb. 6, 2024.

* cited by examiner

DISPLAY SUBSTRATE, METHOD FOR MANUFACTURING SAME, AND DISPLAY DEVICE

CROSS-REFERENCE TO RELATED APPLICATION

The application is a continuation of U.S. patent application Ser. No. 17/604,971, filed on Oct. 19, 2021, which is a 371 of PCT Application No. PCT/CN2020/136098, filed on Dec. 14, 2020, the disclosure of which is herein incorporated by reference in its entirety.

TECHNICAL FIELD

The present disclosure relates to the field of display technologies, and in particular to a display substrate, a method for manufacturing the same, and a display device.

BACKGROUND

Under-screen camera technology is a new technology proposed to increase the screen-to-body ratio of display devices.

SUMMARY

This disclosure provides a display substrate, a method for manufacturing the same, and a display device. The technical solutions are as follows.

In one aspect, a display substrate is provided. The display substrate includes:
a base substrate having a first display region and a second display region, wherein the first display region is at least partially disposed around the second display region; and
a plurality of pixels, each including a pixel circuit and a target electrode connected to each other, wherein the pixel circuit is disposed in the first display region or the second display region, and the target electrode is disposed in the second display region; and the pixel circuit includes a first metal layer, a first insulating layer, at least one transparent conductive line, a second insulating layer, and a second metal layer which are disposed on a side of the base substrate and sequentially stacked, each of the at least one transparent conductive line being connected to one metal layer in the pixel circuit.

Optionally, the first metal layer is a first source-drain metal layer, the second metal layer is a second source-drain metal layer, the first insulating layer is a passivation layer, and the second insulating layer is a first planarization layer.

Optionally, a material of each of the at least one transparent conductive line is indium tin oxide.

Optionally, the target electrode is an anode.

Optionally, the pixel circuit is disposed in the second display region, and an orthographic projection of the pixel circuit on the base substrate is at least partially overlapped with an orthographic projection of the target electrode on the base substrate.

Optionally, the pixel circuit is disposed in the first display region, and the pixel circuit is connected to the target electrode through the transparent conductive line.

Optionally, the at least one transparent conductive line includes a first transparent conductive line;
wherein the first transparent conductive line is connected to the first metal layer and is configured to transmit a power signal, and the first transparent conductive lines in two adjacent pixel circuits disposed in the same column are integrally formed.

Optionally, the at least one transparent conductive line includes a second transparent conductive line;
wherein the second transparent conductive line is connected to the second metal layer and is configured to transmit a data signal, and the second transparent conductive lines in two adjacent pixel circuits disposed in the same column are integrally formed.

Optionally, the pixel circuit further includes a third insulating layer disposed on a side of the second metal layer distal from the base substrate, and a transistor pattern layer, a third metal layer, a fourth metal layer, and a fourth insulating layer which are disposed between the base substrate and the first metal layer and sequentially stacked in a direction going away from the base substrate.

Optionally, the third insulating layer is a second planarization layer, the third metal layer is a first gate metal layer, the fourth metal layer is a second gate metal layer, and the fourth insulating layer is an interlayer dielectric layer.

Optionally, the third metal layer includes a first portion, a second portion, and a third portion; the at least one transparent conductive line includes a third transparent conductive line, a fourth transparent conductive line, and a fifth transparent conductive line; wherein
the third transparent conductive line is connected to the first portion and is configured to transmit a light emission control signal, and the third transparent conductive lines in two adjacent pixel circuits disposed in the same row are integrally formed;
the fourth transparent conductive line is connected to the second portion and is configured to transmit a gate driving signal, and the fourth transparent conductive lines in two adjacent pixel circuits disposed in the same row are integrally formed;
the fifth transparent conductive line is connected to the third portion and is configured to transmit a reset signal, and the fifth transparent conductive lines in two adjacent pixel circuits disposed in the same row are integrally formed.

Optionally, the at least one transparent conductive line includes a sixth transparent conductive line;
wherein the sixth transparent conductive line is connected to the fourth metal layer and is configured to transmit an initial signal, and the sixth transparent conductive lines in two adjacent pixel circuits disposed in the same row are integrally formed.

Optionally, the second display region is a light-transmitting display region.

Optionally, a resolution of the first display region is greater than or equal to a resolution of the second display region.

Optionally, each of the at least one transparent conductive line is connected to one metal layer in the pixel circuit through a via hole.

In another aspect, a method for manufacturing a display substrate is provided. The method includes:
providing a base substrate, wherein the base substrate has a first display region and a second display region, the first display region being at least partially disposed around the second display region;
forming a plurality of pixels on a side of the base substrate, wherein each of the pixels includes a pixel circuit and a target electrode connected to each other;
wherein the pixel circuit is disposed in the first display region or the second display region, and the target electrode is disposed in the second display region; and the pixel circuit includes a first metal layer, a first insulating layer, at least one transparent conductive line, a second insulating layer, and a second metal layer which are sequentially stacked in a direction going away from the base substrate, and each of the at least one transparent conductive line being connected to one metal layer in the pixel circuit.

In yet another aspect, a display device is provided. The display device includes an integrated circuit and the display substrate as described in the above aspect:

the integrated circuit is electrically connected to a transparent conductive line included in a pixel circuit in the display substrate, and the integrated circuit is configured to provide a signal to the transparent conductive line.

Optionally, the display device further includes a photosensitive sensor, wherein the photosensitive sensor is disposed in the second display region of the display substrate.

Optionally, the second display region is rectangular, and an area of an orthographic projection of the photosensitive sensor on the base substrate is less than or equal to an area of an inscribed circle of the second display region.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are further described in detail hereinafter with reference to the accompanying drawings.

In the related art, a display substrate with an under-screen camera generally includes a light-transmitting display region for arranging the camera, and the light-transmitting display region includes a plurality of pixels. In addition, to ensure the light transmittance of the light-transmitting display region, the connecting lines in various pixels in the light-transmitting display region need to be transparent conductive traces.

However, the structure of the display substrate in the related art is relatively complicated, and the manufacturing cost is relatively high.

Figure 1:
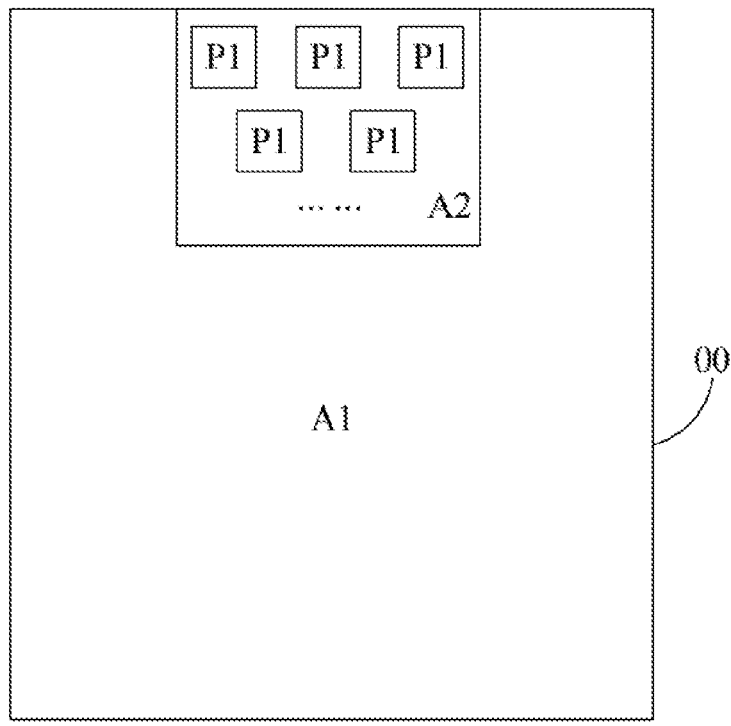
FIG. 1 is a schematic structural diagram of a display substrate according to an embodiment of the present disclosure.

FIG. 1 is a schematic structural diagram of a display substrate according to an embodiment of the present disclosure. As shown in FIG. 1, the display substrate may include a base substrate 00, the base substrate 00 may have a first display region A1 and a second display region A2, and the first display region A1 may be at least partially disposed around the second display region A2.

For example, referring to FIG. 1, which shows that the second display region A2 is disposed at the middle of the top of the base substrate 00. Correspondingly, all four sides of the rectangular second display region A2 may be surrounded by the first display region A1, that is, the second display region A2 may be surrounded by the first display region A1.

In some embodiments, the second display region A2 may not be disposed at the middle of the top of the base substrate 00 as shown in FIG. 1, but at other positions. For example, referring to FIG. 1, the second display region A2 may be disposed at the upper left corner or the upper right corner of the base substrate 00, which is not limited in the embodiments of the present disclosure.

Optionally, the first display region A1 may be set as a non-light-transmitting display region, and the second display region A2 may be set as a light-transmitting display region. That is, the first display region A1 may not transmit light, and the second display region A2 may transmit light. In this way, there is no need to provide a hole on the display substrate, and the required hardware structures, such as a photosensitive sensor, may be directly arranged in the second display region A2, which lays a solid foundation for the realization of the full display.

Figure 2:
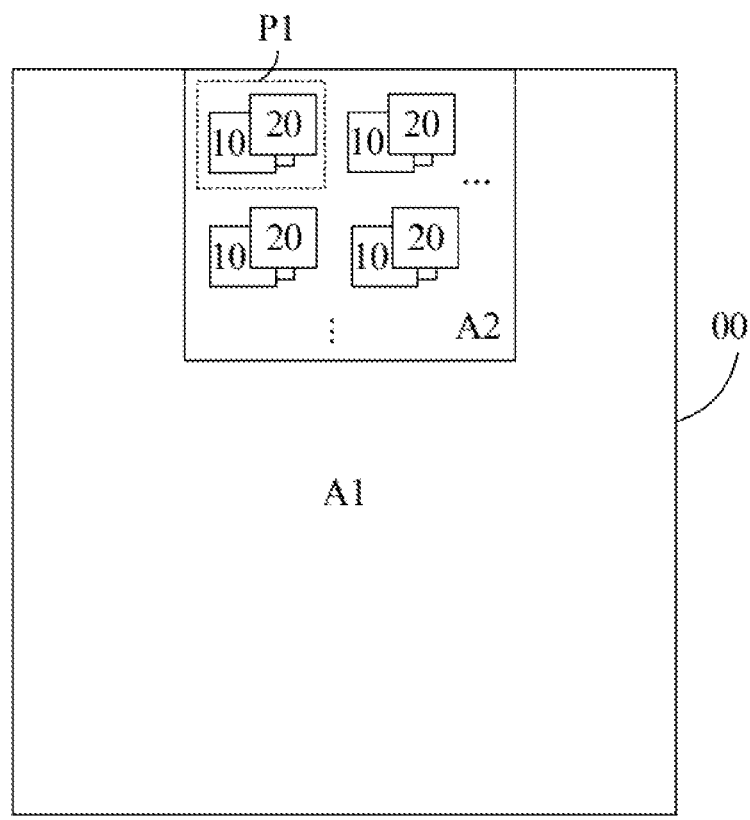
FIG. 2 is a schematic structural diagram of another display substrate according to an embodiment of the present disclosure.
Figure 3:
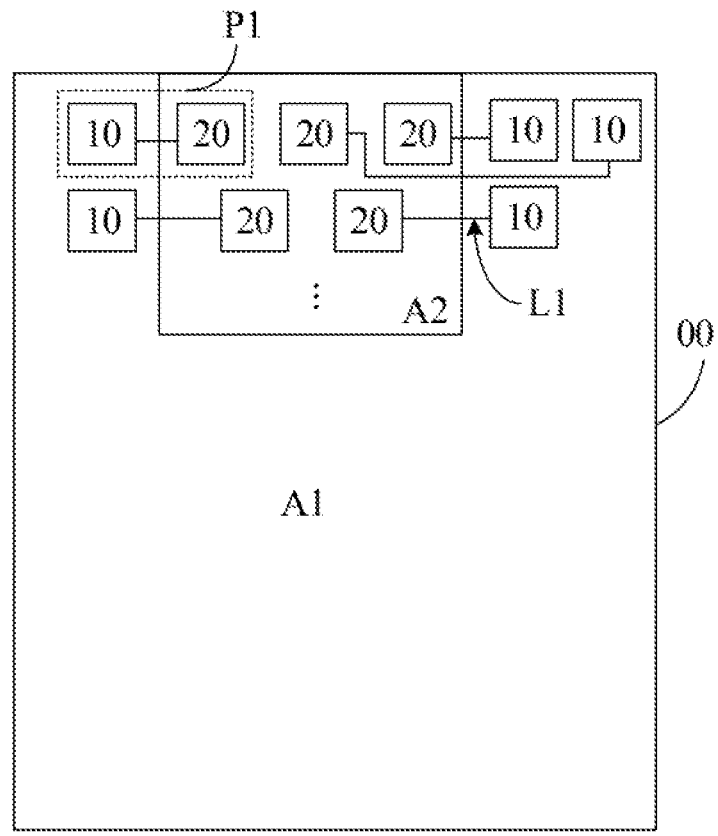
FIG. 3 is a schematic structural diagram of yet another display substrate according to an embodiment of the present disclosure.

FIG. 2 is a schematic structural diagram of another display substrate according to an embodiment of the present disclosure. FIG. 3 is a schematic structural diagram of yet another display substrate according to an embodiment of the present disclosure. Referring to FIGS. 1 to 3, it can be seen that the display substrate may further include a plurality of pixels P1, and each pixel P1 may include a pixel circuit 10 and a target electrode 20 connected to each other. Optionally, the pixel circuit 10 may provide a driving signal to the target electrode 20, such that a potential difference is formed between the target electrode 20 and another electrode included in the pixel P1, and the pixel P1 emits light.

Optionally, referring to FIGS. 2 and 3, the target electrode 20 included in each pixel P1 may be disposed in the second display region A2, and thus it may be determined that the plurality of pixels P1 belong to the second display region A2, that is, they are pixels in the second display region A2. Referring to FIG. 2, the pixel circuit 10 included in each pixel P1 may be disposed in the second display region A2, that is, the pixel circuit 10 included in each pixel P1 may be disposed in the second display region A2 together with the target electrode 20 connected thereto, which may also be referred to as a built-in pixel circuit. Alternatively, referring to FIG. 3, the pixel circuit 10 included in each pixel P1 may be disposed in the first display region A1, that is, the pixel circuit 10 included in each pixel P1 may be separately disposed outside the first display region A1, which may also be referred to as a built-out pixel circuit. In some embodiments, a part of the pixel circuits may be built-in and a part of the pixel circuits may be built-out.

Combining the above description of the first display region A1 and the second display region A2, it can be seen that in the case that the pixel circuit 10 is disposed outside the first display region A1, it can ensure that the second display region A2 has a good light transmittance. In some embodiments, in the case that the pixel circuit 10 is disposed inside the second display region A2, the wiring process can be simplified and the cost can be saved.

Figure 4:
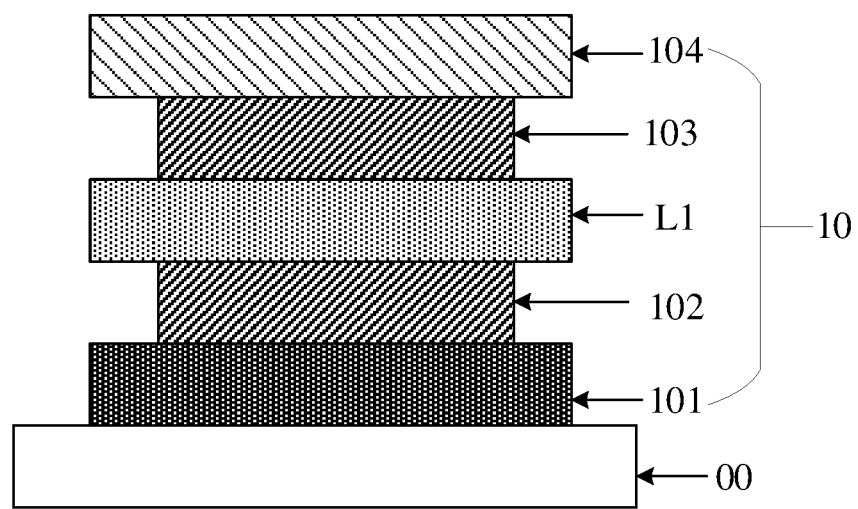
FIG. 4 is a schematic diagram of a hierarchical structure of a pixel circuit according to an embodiment of the present disclosure.

FIG. 4 is a schematic structural diagram of a pixel circuit 10 according to an embodiment of the present disclosure. As shown in FIG. 4, the pixel circuit 10 may include a first metal layer 101, a first insulating layer 102, at least one transparent conductive line L1 (the number is not shown in FIG. 4), a second insulating layer 103, and a second metal layer 104 which are disposed on a side of the base substrate 00 and are sequentially stacked, and each of the at least one transparent conductive line L1 may be connected to one metal layer in the pixel circuit 10 to form a signal line and is configured to connect to a signal terminal. Therefore, the pixel circuit 10 may transmit a driving signal to the target electrode 20 connected thereto under the control of the signals provided by various signal terminals. In addition, the target electrode 20 is generally disposed on a side of the second metal layer 104 distal from the second insulating layer 103, and an insulating layer is also disposed between the target electrode 20 and the second metal layer 104.

It should be noted that FIGS. 1 to 3 only show the pixels P1 in the second display region A2. To ensure the normal operation of the display substrate, the first display region A1 also includes a plurality of pixels. In addition, the first metal layer 101, the first insulating layer 102, the second insulating layer 103, and the second metal layer 104 are an indispensable hierarchical structure included in a pixel circuit of a pixel in any display region. That is, the first insulating layer 102 and the second insulating layer 103 are two existing insulating layers between the first metal layer 101 and the second metal layer 104. The transparent conductive line L1 is a newly added layer to ensure the light transmittance of the second display region A2.

To avoid signal interference between two adjacent conductive layers, at least one insulating layer is generally disposed between the two adjacent conductive layers. Therefore, in combination with the locations of the target electrode 20 and the second metal layer 104, in the case that the transparent conductive line L1 is disposed on a side of the second metal layer 104 distal from the base substrate 00, an additional insulating layer is needed to be disposed to separate the target electrode from the transparent conductive line L1, or to separate the second metal layer 104 from the transparent conductive line L1. However, in the embodiments of the present disclosure, the transparent conductive line L1 is arranged between the two existing insulating layers, such that the arrangement of at least one insulating layer can be omitted. Further, each layer is generally made by a mask process, such that at least one mask process can be omitted. Therefore, it can be determined that the display substrate according to the embodiments of the present disclosure has a simple structure and a low manufacturing cost.

In summary, the embodiments of the present disclosure disclose a display substrate. The display substrate includes a base substrate having a first display region and a second display region, in the pixel circuit included in the pixel in the second display region, the conductive line connected to the metal layer is a transparent conductive line, and the transparent conductive line is disposed between two existing insulating layers. In this way, compared to the display substrate with the transparent conductive line disposed at other positions, the display substrate according to the embodiments of the present disclosure not only ensures a good light transmittance of the second display region, but also has a simple structure and a low manufacturing cost.

Optionally, the target electrode 20 described in the embodiments of the present disclosure may be an anode. Correspondingly, the other electrode described in the above embodiments may be a cathode. In some embodiments, the target electrode 20 may also be a cathode, and accordingly, the other electrode described in the above embodiments may be an anode.

Optionally, a material of each transparent conductive line L1 described in the embodiments of the present disclosure may be indium tin oxide (ITO), such that each transparent conductive line L1 may also be referred to as an ITO trace. In some embodiments, the material of the transparent conductive line L1 may also be other transparent and conductive materials, such as indium gallium zinc oxide (IGZO). The following embodiments of the present disclosure are described by taking the transparent conductive line L1 as the ITO trace.

Figure 5:
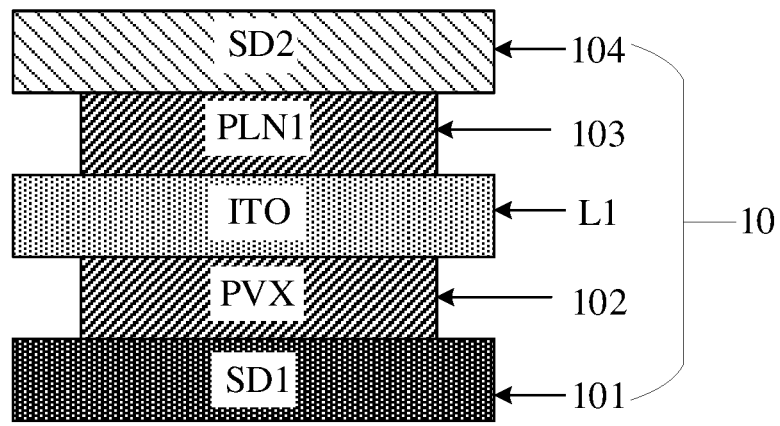
FIG. 5 is a schematic diagram of a hierarchical structure of another pixel circuit according to an embodiment of the present disclosure.

FIG. 5 is a schematic structural diagram of another pixel circuit according to an embodiment of the present disclosure. Referring to FIG. 4 and FIG. 5, it can be seen that the first metal layer 101 described in the embodiments of the present disclosure may be a first source-drain (SD) metal layer, which is referred to as SD1. The second metal layer 104 may be a second source-drain metal layer SD2, the first insulating layer 102 may be a passivation layer (PVX), and the second insulating layer 103 may be a first planarization layer (PLN), which is referred to as PLN1. That is, at least one transparent conductive line L1 described in the embodiments of the present disclosure may be disposed between the passivation layer PVX and the first planarization layer PLN1.

In the processes, various layers are generally formed sequentially in the direction going away from the base substrate 00, and hence it can be determined that at least one transparent conductive line L1 described in the embodiments of the present disclosure is formed on a side of the passivation layer PVX distal from the first source-drain metal layer SD1 after forming the first source-drain metal layer SD1 and the passivation layer PVX and before forming the first planarization layer PLN1. That is, after forming the passivation layer PVX and before forming the first planarization layer PLN1, a process for manufacturing the transparent conductive line L1 may be performed. In addition, referring to FIG. 5, an ITO layer may be formed first, and then one or more ITO traces may be acquired by a patterning process.

Figure 6:
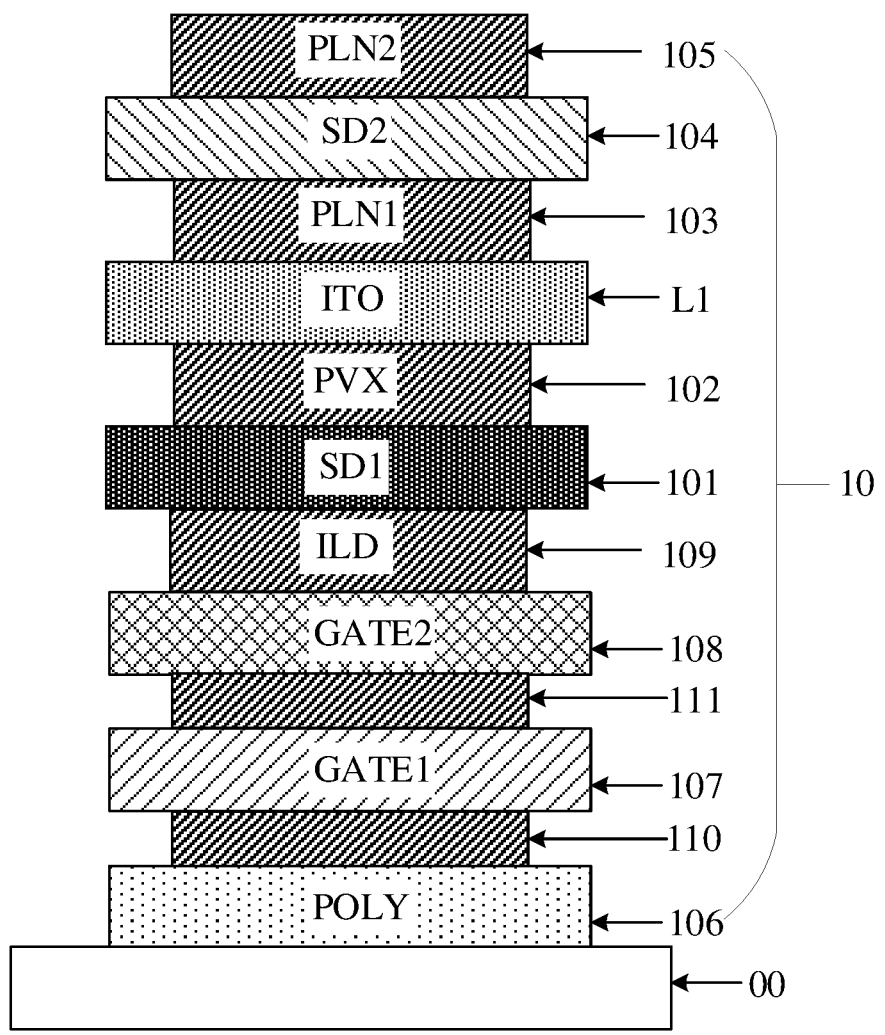
FIG. 6 is a schematic diagram of a hierarchical structure of yet another pixel circuit according to an embodiment of the present disclosure.

Optionally. FIG. 6 is a schematic structural diagram of yet another pixel circuit according to an embodiment of the present disclosure. As shown in FIG. 6, the pixel circuit 10 may further include a third insulating layer 105 disposed on a side of the second metal layer 104 distal from the base substrate 00, and a transistor pattern layer 106, a third metal layer 107, a fourth metal layer 108, and a fourth insulating layer 109 which are disposed between the base substrate 00 and the first metal layer 101 and sequentially stacked in a direction going away from the base substrate 00.

Optionally, with continued reference to FIG. 6, the transistor pattern layer 106 may be a polysilicon material layer, which is referred to as a POLY layer. The third insulating layer 105 may be a second planarization layer PLN2. The third metal layer 107 may be a first gate metal layer, which is referred to as GATE1. The fourth metal layer 108 may be a second gate metal layer GATE2, and the fourth insulating layer 109 may be an interlayer dielectric layer (ILD). In addition, an insulating layer is also generally disposed between the first gate metal layer GATE1 and the second gate metal layer GATE2.

Optionally, with continued reference to FIG. 6, materials of the transistor pattern layer 106, the third metal layer 107, and the fourth metal layer 108 are all conductive materials, such that signal interference between two adjacent conductive layers can be avoided. The pixel circuit 10 may further include an insulating layer 110 disposed between the transistor pattern layer 106 and the third metal layer 107 (i.e., the first gate metal layer GATE1), and an insulating layer 111 disposed between the third metal layer 107 and the fourth metal layer 108 (i.e., the second gate metal layer GATE2).

Figure 7:
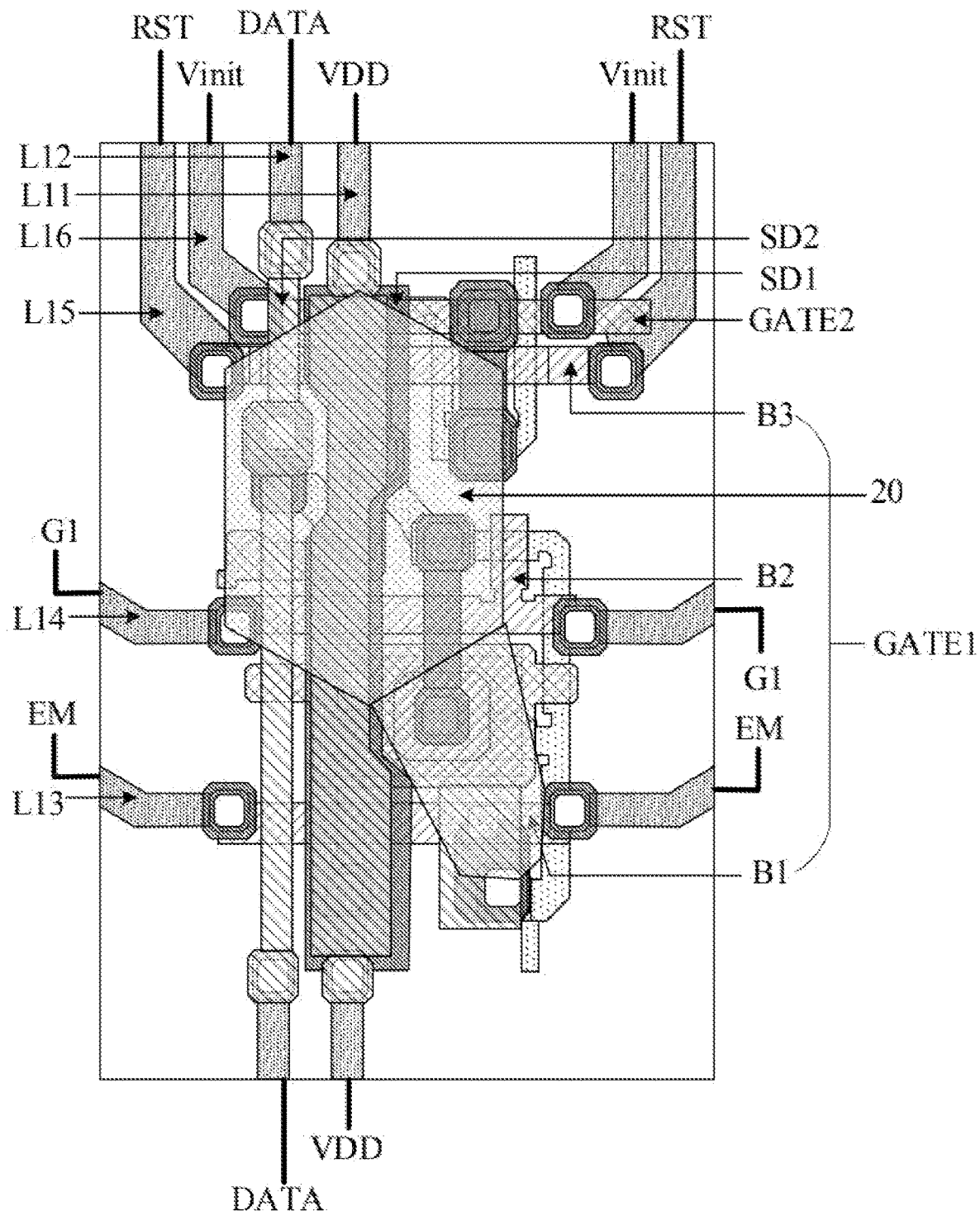
FIG. 7 is a schematic structural diagram of still another display substrate according to an embodiment of the present disclosure.

Optionally, FIG. 7 is a schematic structural diagram of still another display substrate according to an embodiment of the present disclosure. As shown in FIG. 7, the first gate metal layer GATE1 may include a first portion B1, a second portion B2, and a third portion B3. The at least one transparent conductive line L1 may include a first transparent conductive line L11, a second transparent conductive line L12, a third transparent conductive line L13, a fourth transparent conductive line L14, a fifth transparent conductive line L15, and a sixth transparent conductive line L16.

The first transparent conductive line L11 may be connected to the first metal layer 101 (i.e., the first source-drain metal layer SD1), and is configured to transmit a power signal. That is, as shown in FIG. 7, the first transparent conductive line L11 may also be configured to connect to a power terminal VDD, and the power terminal VDD may transmit the power signal to the first source-drain metal layer SD1 through the first transparent conductive line L11. In other words, the first transparent conductive line L11 may be connected to the first source-drain metal layer SD1 to form a power signal line, and the pixel circuit 10 may receive a power signal from the power signal line.

Figure 8:
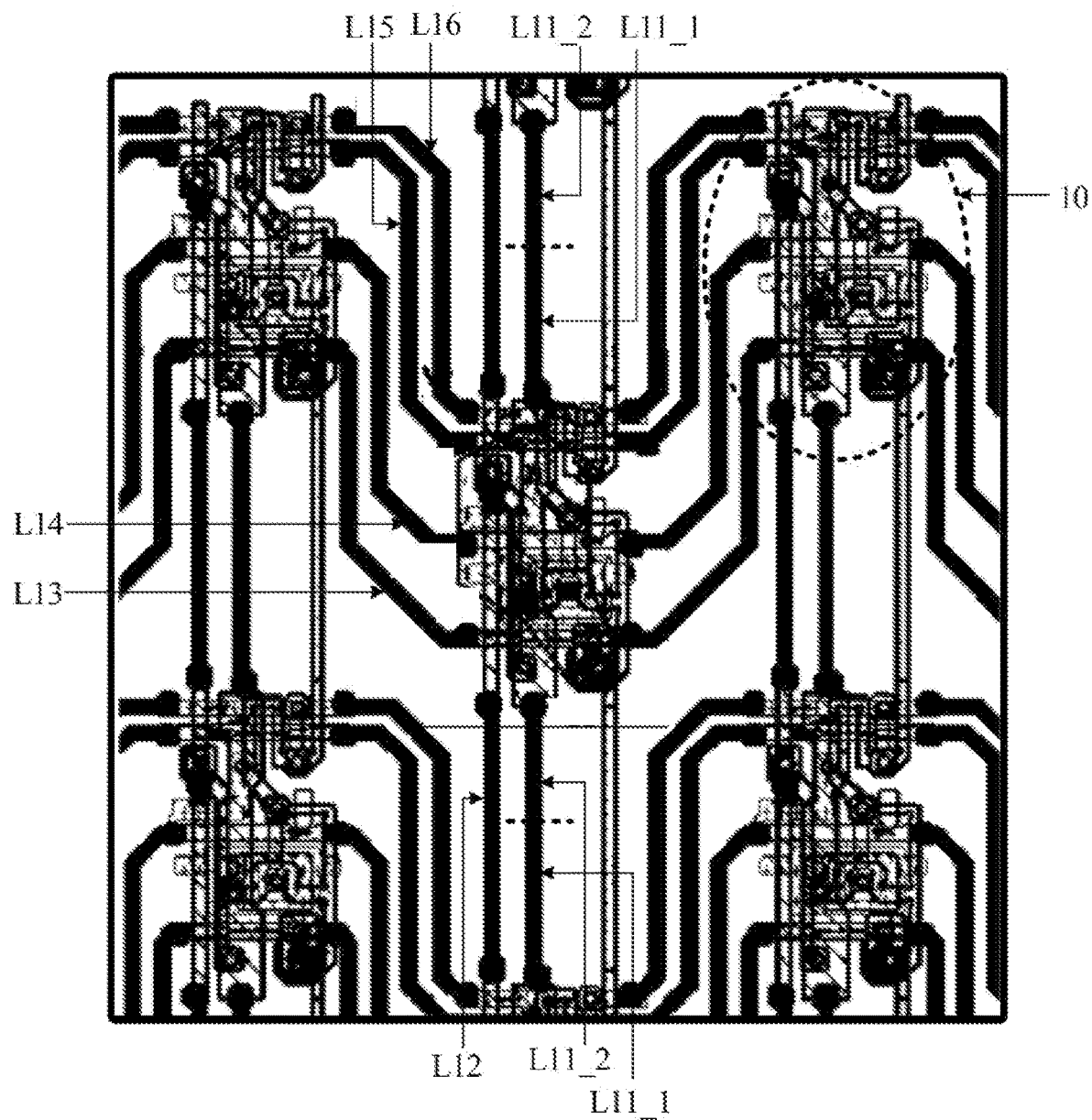
FIG. 8 is a schematic structural diagram of still another display substrate according to an embodiment of the present disclosure.

Optionally, referring to still another display substrate shown in FIG. 8, it can be seen that the first transparent conductive lines L11 in two adjacent pixel circuits 10 disposed in the same column may be integrally formed. In other words, the pixel circuits 10 in the same column may share the same power signal line, that is, be connected to the same DC power terminal VDD.

The second transparent conductive line L12 may be connected to the second metal layer 104 (i.e., the second source-drain metal layer SD2), and is configured to transmit a data signal. That is, as shown in FIG. 7, the second transparent conductive line L12 may also be configured to connect to a data signal terminal DATA, and the data signal terminal DATA may transmit the data signal to the second source-drain metal layer SD2 through the second transparent conductive line L12. In other words, the second transparent conductive line L12 may be connected to the second source-drain metal layer SD2 to form a data signal line, and the pixel circuit 10 may receive the data signal from the data signal line.

Optionally, still referring to FIG. 8, it can be seen that the second transparent conductive lines L12 in two adjacent pixel circuits 10 disposed in the same column may be integrally formed. In other words, the pixel circuits 10 in the same column may share the same data signal line, that is, be connected to the same data signal terminal DATA.

The third transparent conductive line L13 may be connected to the first portion B1 of the first gate metal layer GATE1 and is configured to transmit a light emission control signal. That is, as shown in FIG. 7, the third transparent conductive line L13 may also be configured to connect to a light emission control signal terminal EM, and the light emission control signal terminal EM may transmit a light emission control signal to the first gate metal layer GATE1 through the third transparent conductive line L13. In other words, the third transparent conductive line L13 is connected to the first portion B1 of the first gate metal layer GATE1 to form a light emission control signal line, and the pixel circuit 10 may receive the light emission control signal from the light emission control signal line.

Optionally, referring to still another display substrate shown in FIG. 8, it can be seen that the third transparent conductive lines L13 in two adjacent pixel circuits 10 disposed in the same row may be integrally formed. In other words, the pixel circuits 10 in the same row may share the same light emission control signal line, that is, be connected to the same light emission control signal terminal EM.

The fourth transparent conductive line L14 may be connected to the second portion B2 of the first gate metal layer GATE1 and is configured to transmit a gate driving signal. That is, as shown in FIG. 7, the fourth transparent conductive line L14 may also be configured to connect to a gate signal terminal G1, and the gate signal terminal G1 may transmit the gate driving signal to the first gate metal layer GATE1 through the fourth transparent conductive line L14. In other words, the fourth transparent conductive line L14 is connected to the second portion B2 of the first gate metal layer GATE1 to form a gate line, and the pixel circuit 10 may receive a gate driving signal from the gate line.

Optionally, referring to still another display substrate shown in FIG. 8, it can be seen that the fourth transparent conductive lines L14 in two adjacent pixel circuits 10 disposed in the same row may be integrally formed. In other words, the pixel circuits 10 in the same row may share the same gate line, that is, be connected to the same gate signal terminal G1.

The fifth transparent conductive line L15 may be connected to the third portion B3 of the first gate metal layer GATE1 and is configured to transmit a reset signal. That is, as shown in FIG. 7, the fifth transparent conductive line L15 may also be configured to connect to a reset signal terminal RST, and the reset signal terminal RST may transmit a reset signal to the first gate metal layer GATE1 through the fifth transparent conductive line L15. In other words, the fifth transparent conductive line L15 may be connected to the third portion B3 of the first gate metal layer GATE1 to form a reset signal line, and the pixel circuit 10 may receive a reset signal from the reset signal line.

Optionally, referring to still another display substrate shown in FIG. 8, it can be seen that the fifth transparent conductive lines L15 in two adjacent pixel circuits 10 disposed in the same row may be integrally formed. In other words, the pixel circuits 10 in the same row may share the same reset signal line, that is, be connected to the same reset signal terminal RST.

The sixth transparent conductive line L16 may be connected to the fourth metal layer 108 (i.e., the second gate metal layer GATE2), and is configured to transmit an initial signal. That is, as shown in FIG. 7, the sixth transparent conductive line L16 may also be configured to connect to an initial signal terminal Vinit, and the initial signal terminal Vinit may transmit the initial signal to the second gate metal layer GATE2 through the sixth transparent conductive line L16. In other words, the sixth transparent conductive line L16 may be connected to the second gate metal layer GATE2 to form an initial signal line, and the pixel circuit 10 may receive an initial signal from the initial signal line.

Optionally, referring to still another display substrate shown in FIG. 8, it can be seen that the sixth transparent conductive lines L16 in two adjacent pixel circuits 10 disposed in the same row may be integrally formed. In other words, the pixel circuits 10 in the same row may share the same initial signal line, that is, be connected to the same initial signal terminal Vinit. In some embodiments, the pixel circuits 10 included in all the pixels P1 in the second display region A2 may be connected to the same initial signal terminal Vinit.

It should be noted that referring to FIG. 7 and FIG. 8, the pixel circuit 10 may include a plurality of transistors. Receiving signals through the pixel circuit 10 described in the above embodiments refer to receiving signals through the transistors. Under the driving of the above signals, the pixel circuit 10 may work reliably and transmit a driving signal to the connected target electrode 20.

It should also be noted that referring to FIG. 8, to further ensure the light transmittance of the second display region A2, the rows and columns in the second display region A2 are not strictly aligned side by side. In addition, one pixel circuit 10 may be adjacent to another pixel circuit 10 on any side, referring to FIG. 7 and FIG. 8, it can be seen that each type of transparent conductive line may be divided into two parts, in which one part is integrally formed with the corresponding type of transparent conductive line of one adjacent pixel circuit 10, and the other part is integrally formed with the corresponding type of transparent conductive line of another adjacent pixel circuit 10.

For example, taking the first transparent conductive line L11 as an example, referring to FIGS. 7 and 8, it can be seen that the first transparent conductive line L11 of the pixel circuit 10 at the center position may include an upper half L11_1 and a lower half L11_2. The upper half L11_1 and the lower half L11_2 of the first transparent conductive line L11 of the pixel circuit 10 adjacent above are integrally formed; and the lower half L11_2 and the upper half L11_1 of the first transparent conductive line L11 of the pixel circuit 10 adjacent below are integrally formed.

Optionally, in the embodiments of the present disclosure, each transparent conductive line L1 may be connected to one metal layer in the pixel circuit 10 through a via hole.

Figure 9:
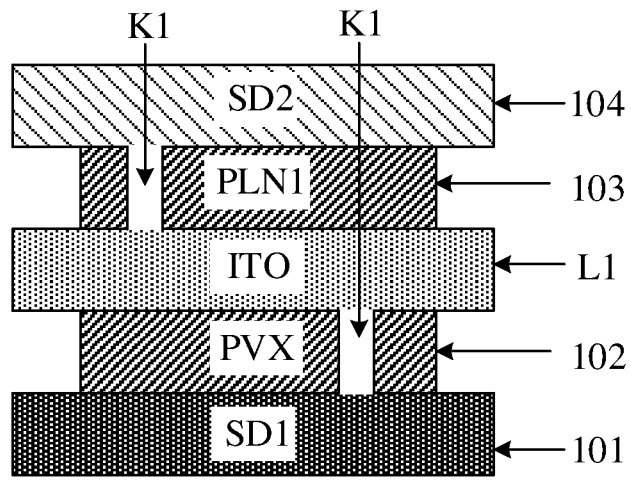
FIG. 9 is a schematic diagram of a hierarchical structure of a pixel circuit including a via hole according to an embodiment of the present disclosure.

For example, taking the connections between the transparent conductive line L1 and the first source-drain metal layer SD1 and the second source-drain metal layer SD2 as an example, FIG. 9 shows a structural layout including a via hole K1. Referring to FIG. 9, it can be seen that each of the passivation layer PVX and the first planarization layer PLN1 includes a via hole K1, and the transparent conductive line L1 may be connected to the first source-drain metal layer SD1 through the via hole K1 provided in the passivation layer PVX; the transparent conductive line L1 may be connected to the second source-drain metal layer SD2 through the via hole K1 provided in the first planarization layer PLN1.

Figure 10:
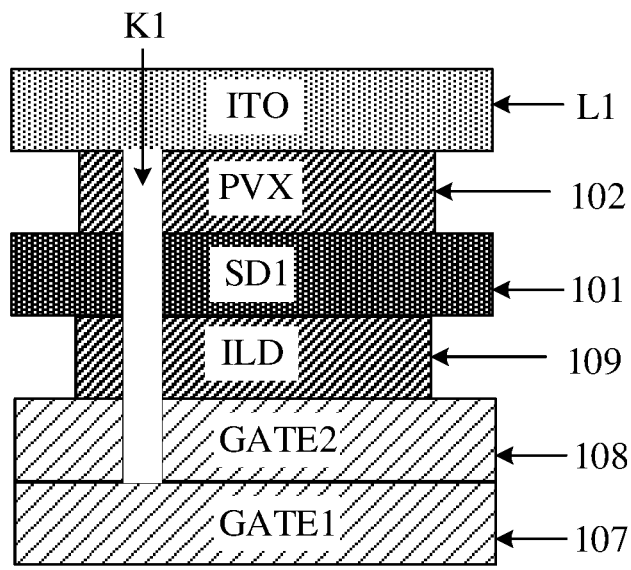
FIG. 10 is a schematic diagram of a hierarchical structure of another pixel circuit including a via hole according to an embodiment of the present disclosure.

For another example, taking the connection between the transparent conductive line L1 and the first gate metal layer GATE1 as an example, FIG. 10 shows a structural layout including a via hole K1. Referring to FIG. 10, it can be seen that a via hole K1 is provided in the passivation layer PVX, the first source-drain metal layer SD1, the interlayer dielectric layer ILD, and the second gate metal layer GATE2 between the transparent conductive line L1 and the first gate metal layer GATE1, and the via hole K1 extends through the passivation layer PVX, the first source-drain metal layer SD1, the interlayer dielectric layer ILD, and the second gate metal layer GATE2. The transparent conductive line L1 may be connected to the first gate metal layer GATE1 through the via hole K1.

Figure 11:
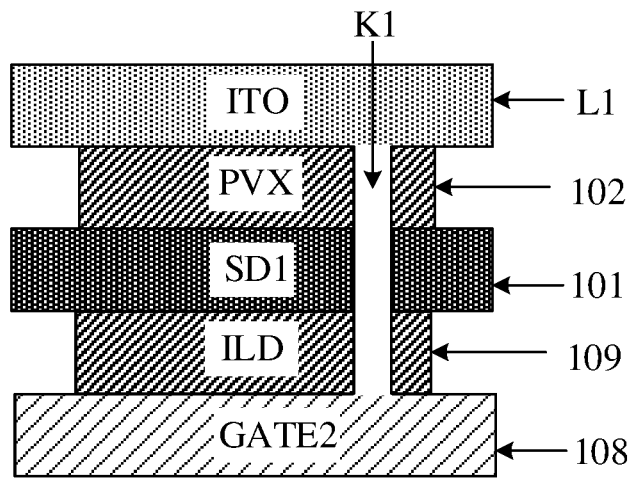
FIG. 11 is a schematic diagram of a hierarchical structure of yet another pixel circuit including a via hole according to an embodiment of the present disclosure.

For still another example, taking the connection between the transparent conductive line L1 and the second gate metal layer GATE2 as an example, FIG. 11 shows a structural layout including a via hole K1. Referring to FIG. 11, it can be seen that a via hole K1 is provided in the passivation layer PVX, the first source-drain metal layer SD1, and the interlayer dielectric layer ILD between the transparent conductive line L1 and the second gate metal layer GATE2, and the via hole K1 extends through the passivation layer PVX, the first source-drain metal layer SD1, and the interlayer dielectric layer ILD. The transparent conductive line L1 may be connected to the second gate metal layer GATE2 through the via hole K1.

According to the descriptions of the above embodiments, the transparent conductive line L1 described in the embodiments of the present disclosure is disposed between the passivation layer PVX and the first planarization layer PLN1, such that the depth of each via hole K1 provided above is relatively shallow, which is easy to form a benign contact, thus ensuring connection reliability.

Optionally, with reference to FIG. 2, the pixel circuit 10 may be disposed in the second display region A2, that is, the pixel circuit 10 may be built-in. In this way, an orthographic projection of the pixel circuit 10 on the base substrate 00 may be at least partially overlapped with an orthographic projection of the target electrode 20 on the base substrate 00. Correspondingly, the connection between the pixel circuit 10 and the target electrode 20 may be the connection between the pixel circuit 10 and the target electrode 20 through a via hole.

For example, in the display substrate shown in FIG. 7, the orthographic projection of the pixel circuit 10 on the base substrate 00 covers the orthographic projection of the target electrode 20 on the base substrate 00).

Optionally, referring to FIG. 3, the pixel circuit 10 may be disposed in the first display region A1. In this way, the pixel circuit 10 may be connected to the target electrode 20 through the transparent conductive line L1. For example, the second source-drain metal layer SD2 may be connected to the transparent conductive line L1 through a via hole, and the transparent conductive line L1 may be connected to the target electrode 20. In this way, a reliable connection between the second source-drain metal layer SD2 and the target electrode 20 can be ensured.

Figure 12:
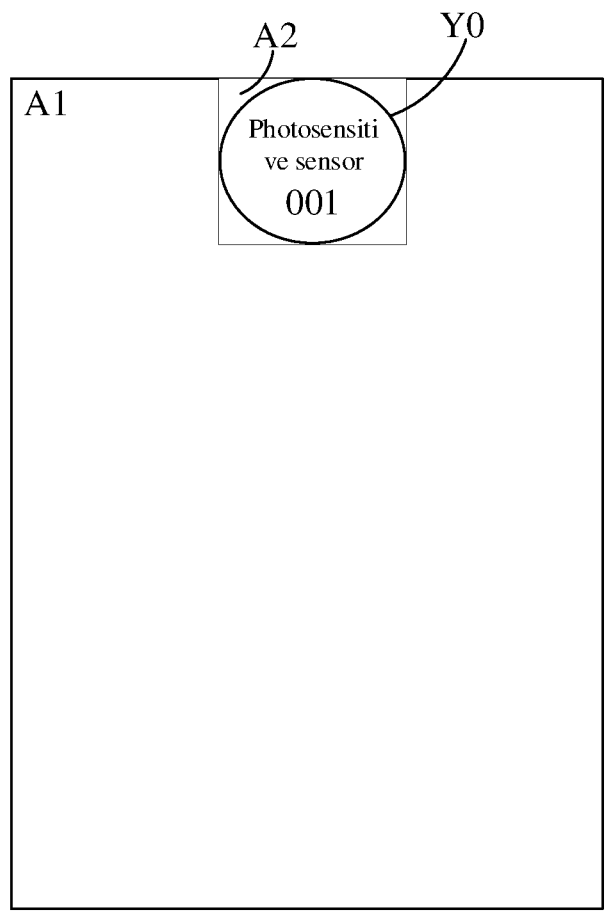
FIG. 12 is a schematic structural diagram of still another display substrate according to an embodiment of the present disclosure.

Optionally, in the embodiments of the present disclosure, the base substrate 00 has a light-transmitting display region, that is, the second display region A2, as shown in FIG. 12, a photosensitive sensor 001 (for example, a camera) in a display module included in the display device may be directly arranged in the second display region A2, that is, there is no need to provide an additional hole on the display panel. In this way, a solid foundation has been laid for the realization of a full-screen display panel.

Optionally, the second display region A2 may be rectangular, and an area of an orthographic projection of the photosensitive sensor 001 on the base substrate 00 may be less than or equal to an area of an inscribed circle of the second display region A2. That is, the size of the area where the photosensitive sensor 001 is disposed may be less than or equal to the size of the inscribed circle of the second display region A2. For example, combined with the display panel shown in FIG. 12, the size of the area where the photosensitive sensor 001 is disposed is equal to the size of the inscribed circle Y0 of the second display region A2, that is, the shape of the area where the photosensitive sensor 001 is disposed may be a circle. Correspondingly, the area where the photosensitive sensor 001 is disposed may also be referred to as a light-transmitting hole. In some embodiments, the second display region A2 may be in a shape other than a rectangle, such as a circle or an ellipse.

Optionally, a resolution of the first display region A1 may be greater than a resolution of the second display region A2. That is, an area of the first display region A1 is larger than an area of the second display region A2, and the number of pixels included in the first display region A1 is greater than the number of pixels included in the second display region A2. Moreover, a density of the plurality of pixels P1 disposed in the second display region A2 may be different from a density of the plurality of pixels disposed in the first display region A1. That is, the number of pixels included per inch in the first display region A1 is different from the number of pixels included per inch in the second display region A2.

In some embodiments, the resolution of the first display region A1 may be less than or equal to the resolution of the second display region A2. For example, the area of the first display region A1 may be the same as the area of the second display region A2, and the number of pixels per unit area included in the first display region A1 is the same as the number of pixels per unit area included in the second display region A2. Alternatively, the area of the first display region A1 may be smaller than the area of the second display region A2, and the number of pixels per unit area included in the first display region A1 is less than the number of pixels per unit area included in the second display region A2.

In summary, the embodiments of the present disclosure discloses a display substrate. The display substrate includes a base substrate having a first display region and a second display region, in the pixel circuit included in the pixel in the second display region, the conductive line connected to the metal layer is a transparent conductive line, and the transparent conductive line is disposed between two existing insulating layers. In this way, compared to the display substrate with the transparent conductive line disposed at other positions, the display substrate according to embodiments of the present disclosure not only ensures a good light transmittance of the second display region, but also has a simple structure and a low manufacturing cost.

Figure 13:
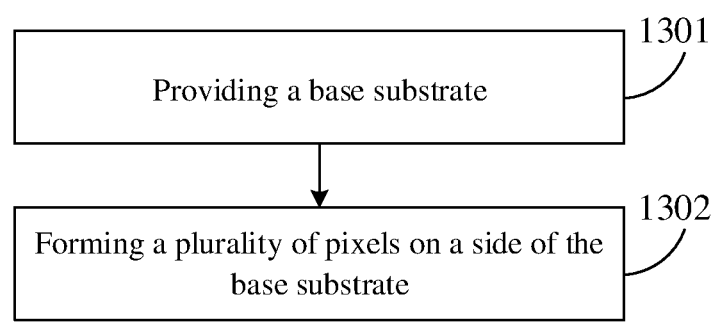
FIG. 13 is a flowchart of a method for manufacturing a display substrate according to an embodiment of the present disclosure.

FIG. 13 is a flowchart of a method for manufacturing a display substrate according to an embodiment of the present disclosure. The method may be used to manufacture the display substrate shown in any of the FIGS. 1 to 3, 7, 8, and 12. As shown in FIG. 13, the method may include the following steps.

In step 1301, a base substrate is provided.

Referring to FIG. 1, the base substrate may have a first display region A1 and a second display region A2, and the first display region A1 may be at least partially disposed around the second display region A2.

In step 1302, a plurality of pixels are formed on a side of the base substrate.

Referring to FIG. 2 and FIG. 3, each pixel P1 may include a pixel circuit 10 and a target electrode 20 connected to each other. The pixel circuit 10 may be disposed in the first display region A1 or the second display region A2, and the target electrode 20 may be disposed in the second display region A2. Referring to FIG. 4, the pixel circuit 10 may include a first metal layer 101, a first insulating layer 102, at least one transparent conductive line L2, a second insulating layer 103, and a second metal layer 104 which are sequentially stacked in a direction going away from the base substrate 00, each transparent conductive line L1 may be connected to one metal layer in the pixel circuit 10.

Figure 14:
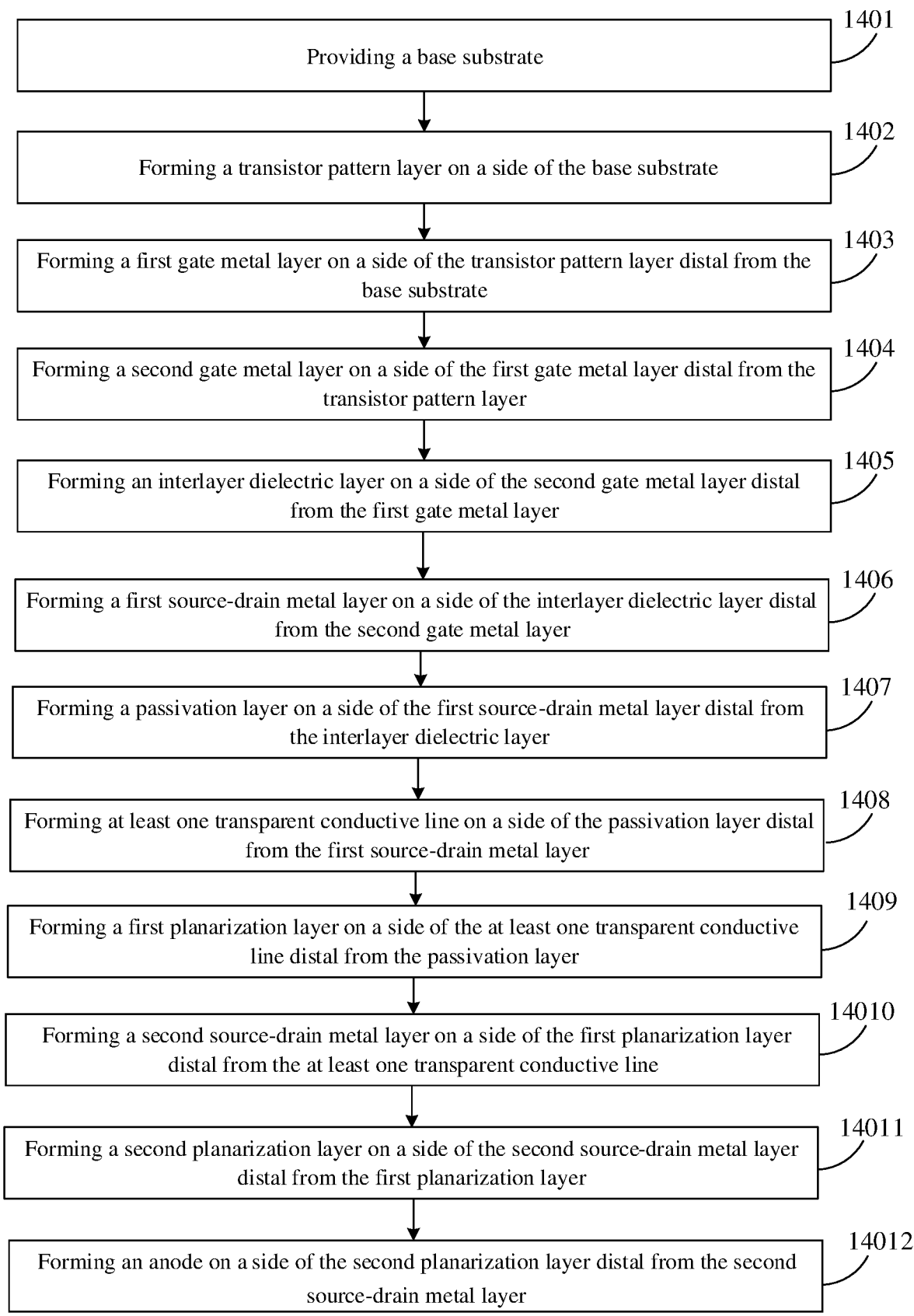
FIG. 14 is a flowchart of another method for manufacturing a display substrate according to an embodiment of the present disclosure.

Optionally, taking the pixel circuit 10 shown in FIGS. 6 and 7, the target electrode being the anode and the pixel circuit being built-in as an example, FIG. 14 shows a flowchart of another method for manufacturing a display substrate according to an embodiment of the present disclosure. As shown in FIG. 14, the method may include the following steps.

In step 1401, a base substrate is provided.

Optionally, the base substrate may be provided as a carrier first, and the base substrate may have at least a first display region and a second display region at least partially surrounded by the first display region. The base substrate may be a glass substrate or a flexible substrate.

In step 1402, a transistor pattern layer is formed on a side of the base substrate.

Optionally, after the base substrate is acquired, the transistor pattern layer may be formed on the side of the base substrate by a patterning process first. Optionally, the patterning process may include gluing, exposure, development, and etching.

Figure 15:
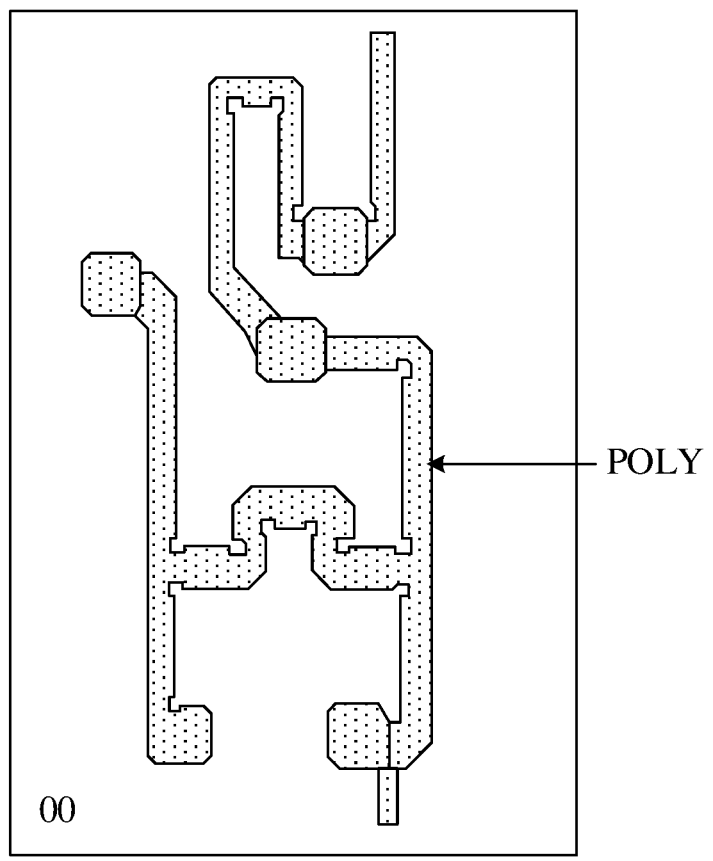
FIG. 15 is a structural layout of a display substrate including a transistor pattern layer according to an embodiment of the present disclosure.

For example, FIG. 15 shows a schematic structural diagram of a base substrate 00 formed with a transistor pattern layer, that is, a POLY layer.

In step 1403, a first gate metal layer is formed on a side of the transistor pattern layer distal from the base substrate.

Optionally, after the transistor pattern layer is formed, the first gate metal layer may be continuously formed on the side of the transistor pattern layer distal from the base substrate.

Figure 16:
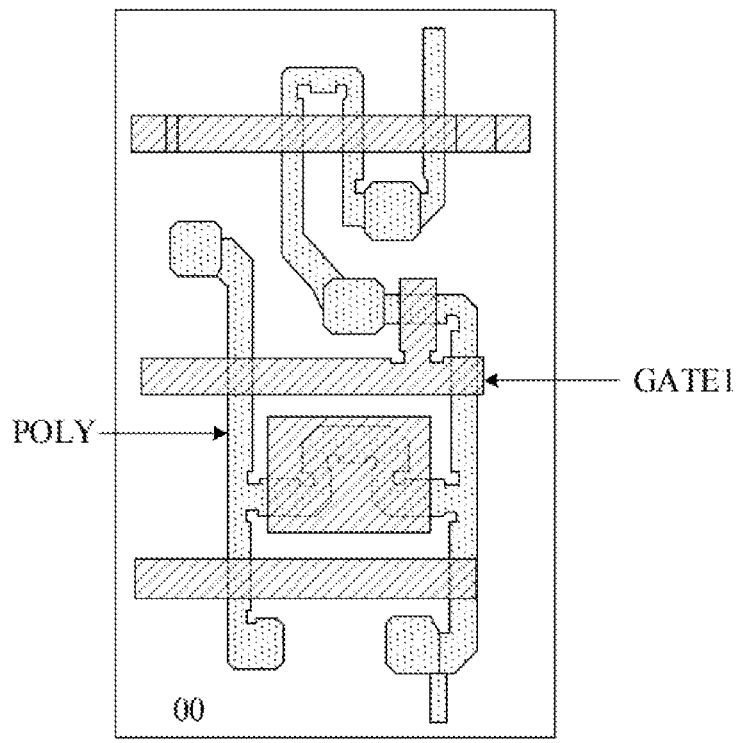
FIG. 16 is a structural layout of a display substrate including a transistor pattern layer and a first gate metal layer according to an embodiment of the present disclosure.

For example, FIG. 16 shows a schematic structural diagram of a base substrate 00 formed with a first gate metal layer GATE1.

In step 1404, a second gate metal layer is formed on a side of the first gate metal layer distal from the transistor pattern layer.

Optionally, after the first gate metal layer is formed, the second gate metal layer may be continuously formed on the side of the first gate metal layer distal from the transistor pattern layer.

Figure 17:
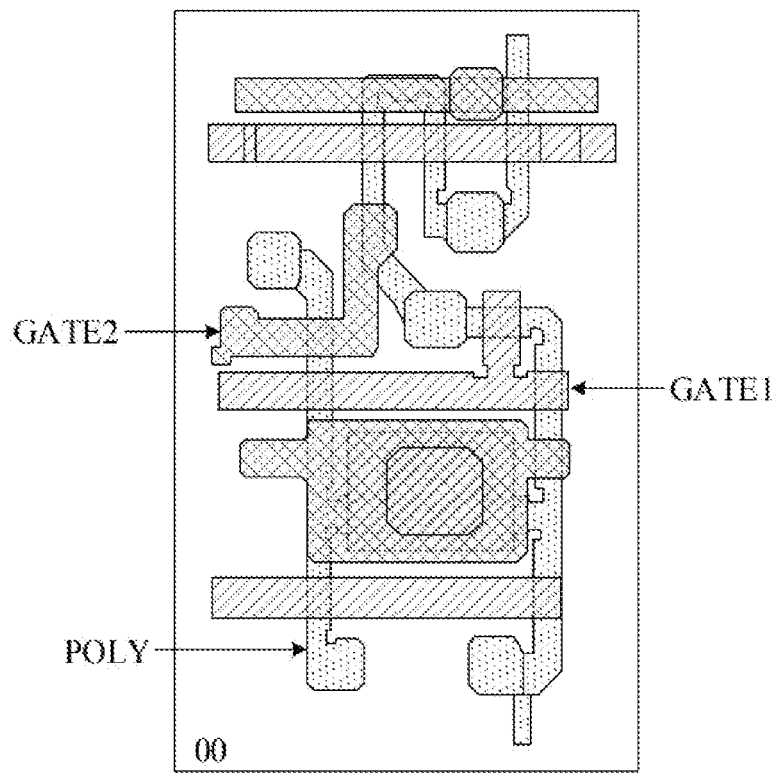
FIG. 17 is a structural layout of a display substrate including a transistor pattern layer, a first gate metal layer, and a second gate metal layer according to an embodiment of the present disclosure.

For example, FIG. 17 shows a schematic structural diagram of a base substrate 00 formed with a second gate metal layer GATE2.

In step 1405, an interlayer dielectric layer is formed on a side of the second gate metal layer distal from the first gate metal layer.

Optionally, after the second gate metal layer is formed, the interlayer dielectric layer may be continuously formed on the side of the second gate metal layer distal from the first gate metal layer. Further, after the interlayer dielectric layer is formed, the interlayer dielectric layer may be processed to acquire a plurality of connection via holes.

Figure 18:
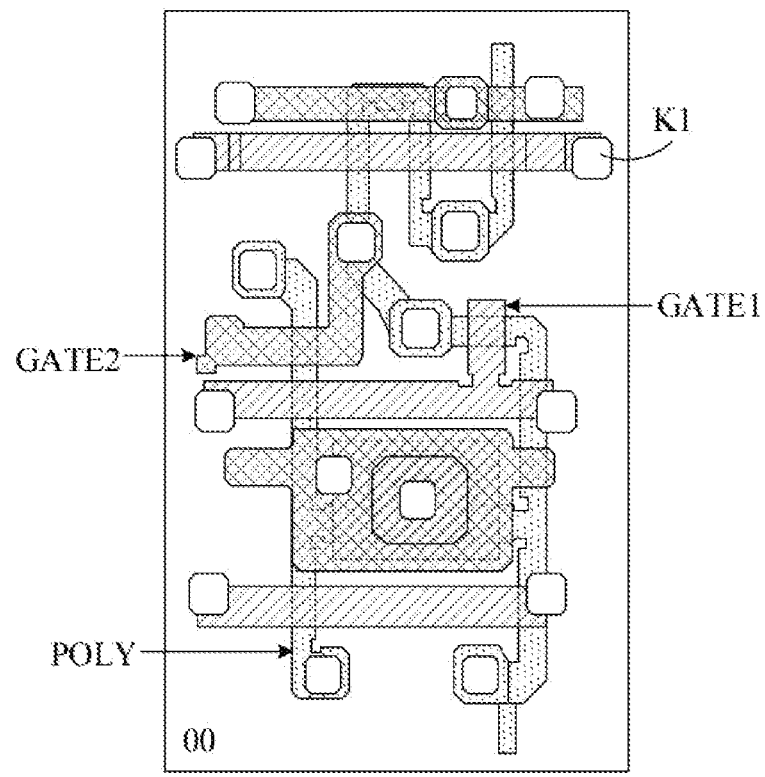
FIG. 18 is a structural layout of a display substrate including a transistor pattern layer, a first gate metal layer, a second gate metal layer, and a via hole according to an embodiment of the present disclosure.

For example, FIG. 18 shows a schematic structural diagram of the base substrate 00 with the via hole K1 formed on the second gate metal layer GATE2.

In step 1406, a first source-drain metal layer is formed on a side of the interlayer dielectric layer distal from the second gate metal layer.

Optionally, after the interlayer dielectric layer is formed, the first source-drain metal layer may be continuously formed on the side of the interlayer distal from the second gate metal layer.

Figure 19:
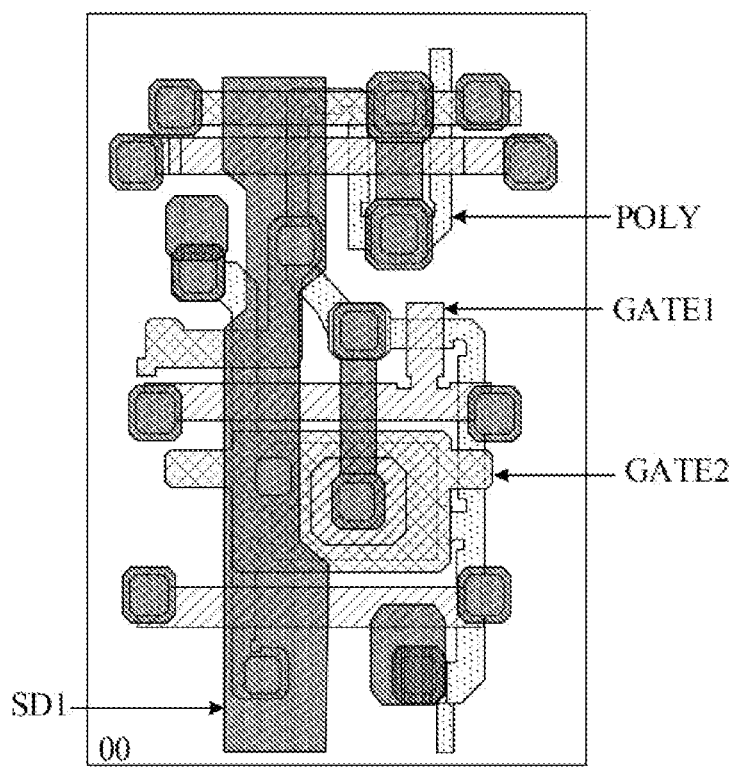
FIG. 19 is a structural layout of a display substrate including a transistor pattern layer, a first gate metal layer, a second gate metal layer, a via hole, and a first source-drain metal layer according to an embodiment of the present disclosure.

For example, FIG. 19 shows a schematic structural diagram of the base substrate 00 with the first source-drain metal layer SD1 formed on the via hole K1.

In step 1407, a passivation layer is formed on a side of the first source-drain metal layer distal from the interlayer dielectric layer.

Optionally, after the first source-drain metal layer is formed, the passivation layer may be continuously formed on the side of the first source-drain metal layer distal from the interlayer. Further, after the passivation layer is formed, the passivation layer may be processed to acquire a plurality of connection via holes.

Figure 20:
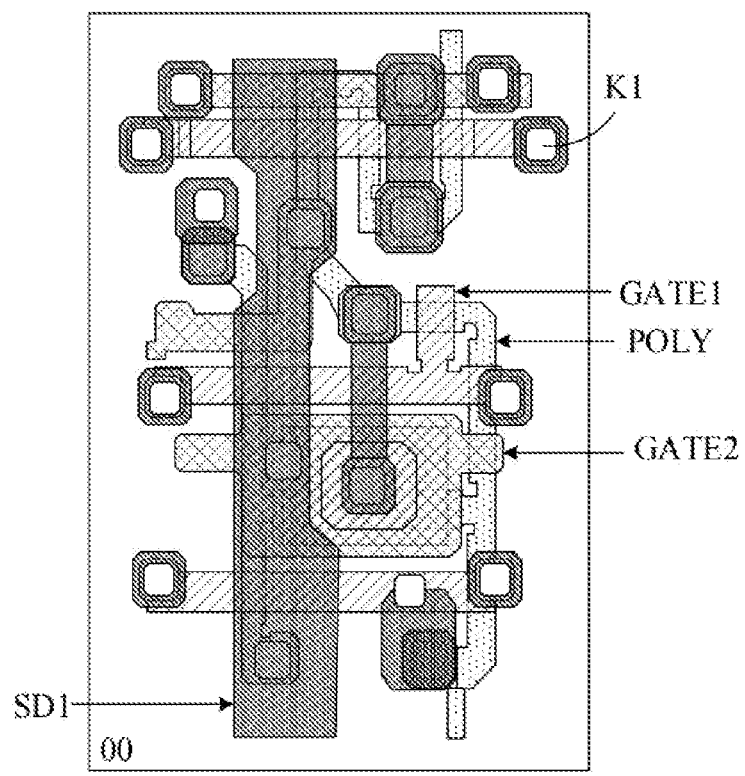
FIG. 20 is a structural layout of another display substrate including a transistor pattern layer, a first gate metal layer, a second gate metal layer, a via hole, and a first source-drain metal layer according to an embodiment of the present disclosure.

For example, FIG. 20 shows a schematic structural diagram of the base substrate 00 with the via hole K1 formed on the first source-drain metal layer SD1.

In step 1408, at least one transparent conductive line is formed on a side of the passivation layer distal from the first source-drain metal layer.

Optionally, after the passivation layer is formed, a transparent conductive layer may be continuously formed on the side of the passivation layer distal from the first source-drain metal layer, and then the transparent conductive layer may be processed to acquire one or more transparent conductive lines.

Figure 21:
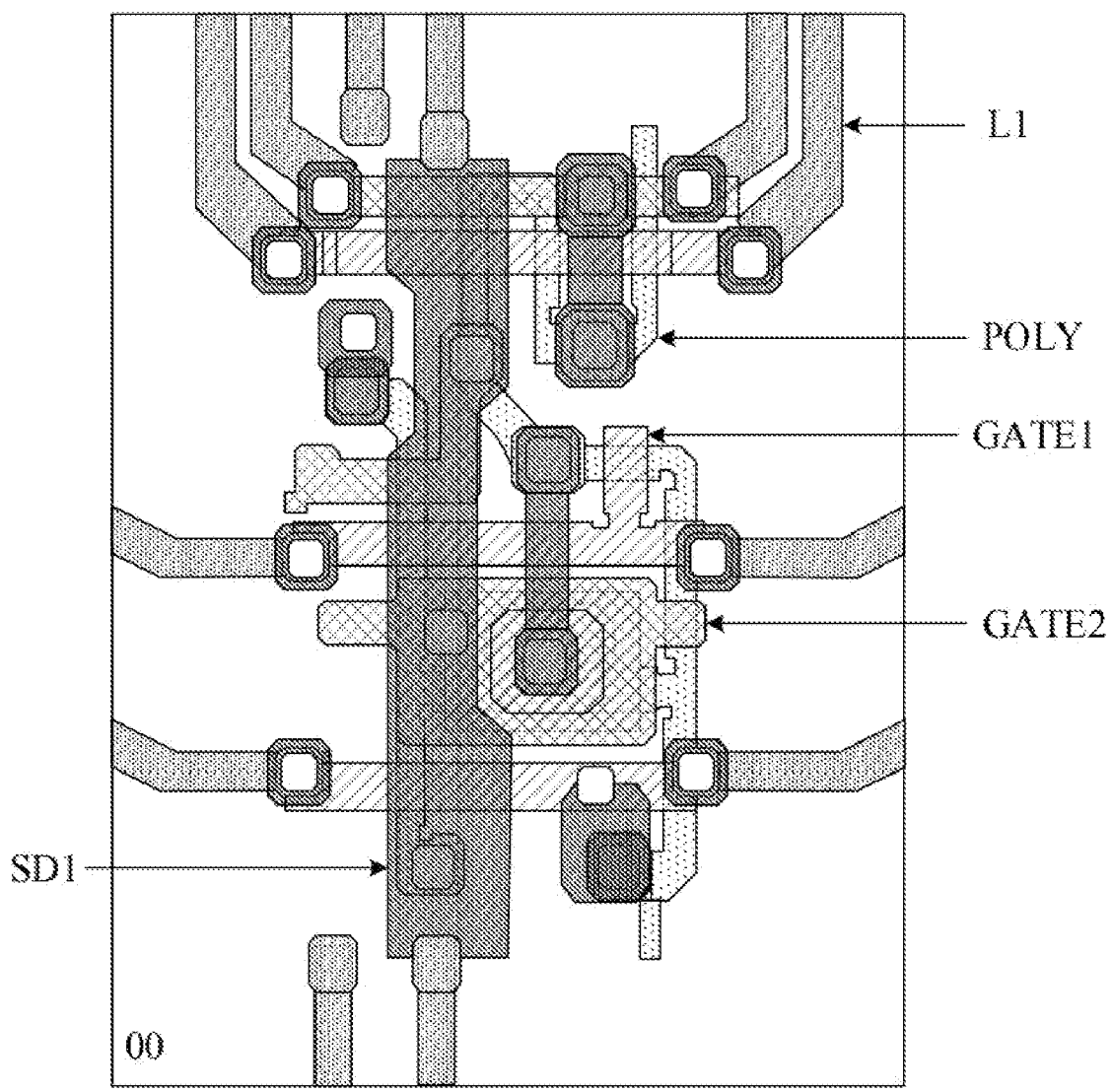
FIG. 21 is a structural layout of a display substrate including a transistor pattern layer, a first gate metal layer, a second gate metal layer, a via hole, a first source-drain metal layer, and a transparent conductive line according to an embodiment of the present disclosure.

For example, FIG. 21 shows a schematic structural diagram of a base substrate 00 with a plurality of first transparent conductive lines L1 formed on the via hole K1.

In step 1409, a first planarization layer is formed on a side of the at least one transparent conductive line distal from the passivation layer.

Optionally, after the at least one transparent conductive line is formed, the first planarization layer may be continuously formed on the side of the at least one transparent conductive line distal from the passivation layer. Further, after the first planarization layer is formed, the first planarization layer may be processed to acquire a plurality of connection via holes.

Figure 22:
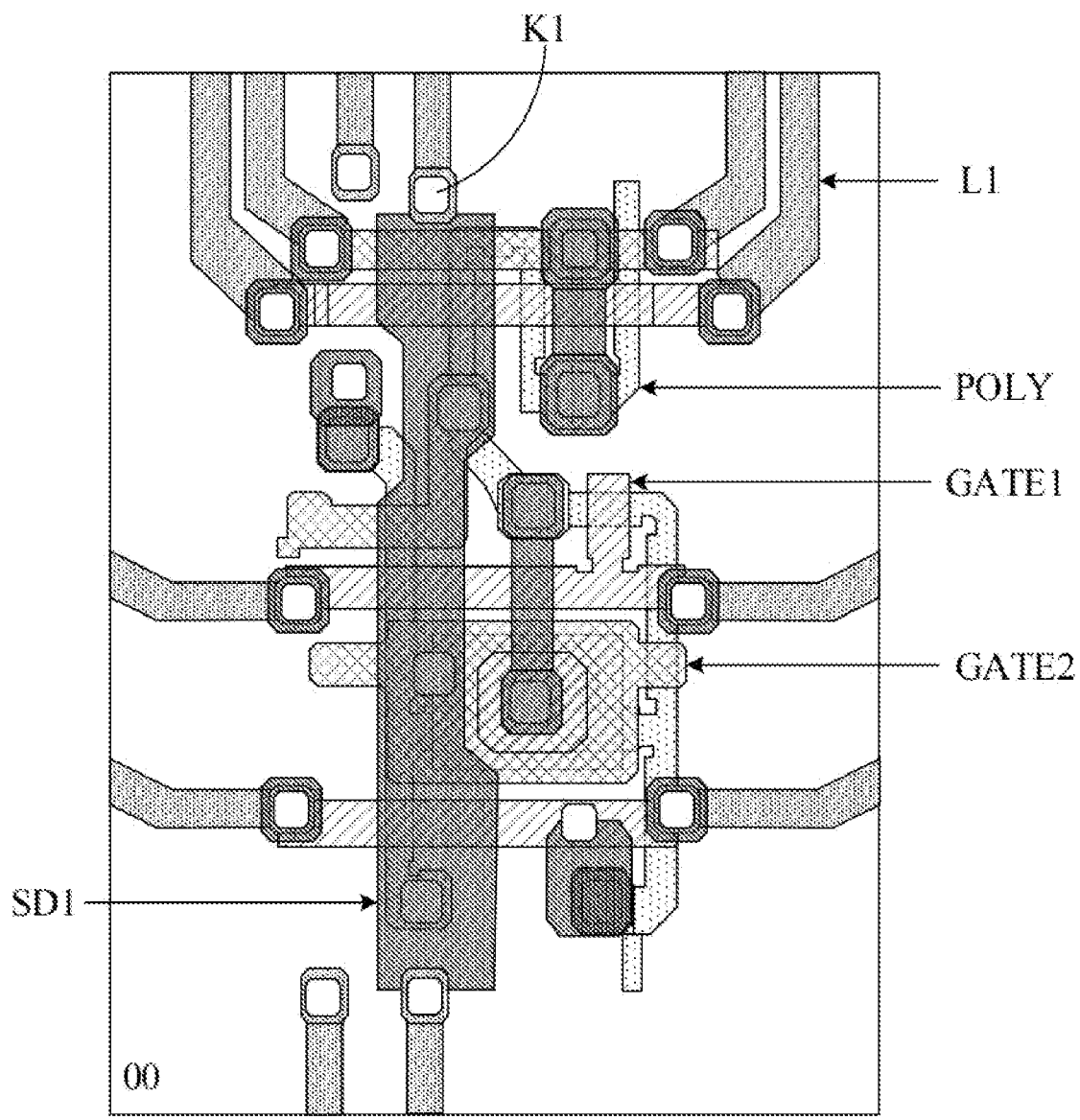
FIG. 22 is a structural layout of another display substrate including a transistor pattern layer, a first gate metal layer, a second gate metal layer, a via hole, a first source-drain metal layer, and a transparent conductive line according to an embodiment of the present disclosure.

For example, FIG. 22 shows a schematic structural diagram of a base substrate 00 with a via hole K1 formed on at least one transparent conductive line L1.

In step 14010, a second source-drain metal layer is formed on a side of the first planarization layer distal from the at least one transparent conductive line.

Optionally, after the first planarization layer is formed, the second source-drain metal layer may be continuously formed on the side of the first planarization layer distal from the at least one transparent conductive line.

Figure 23:
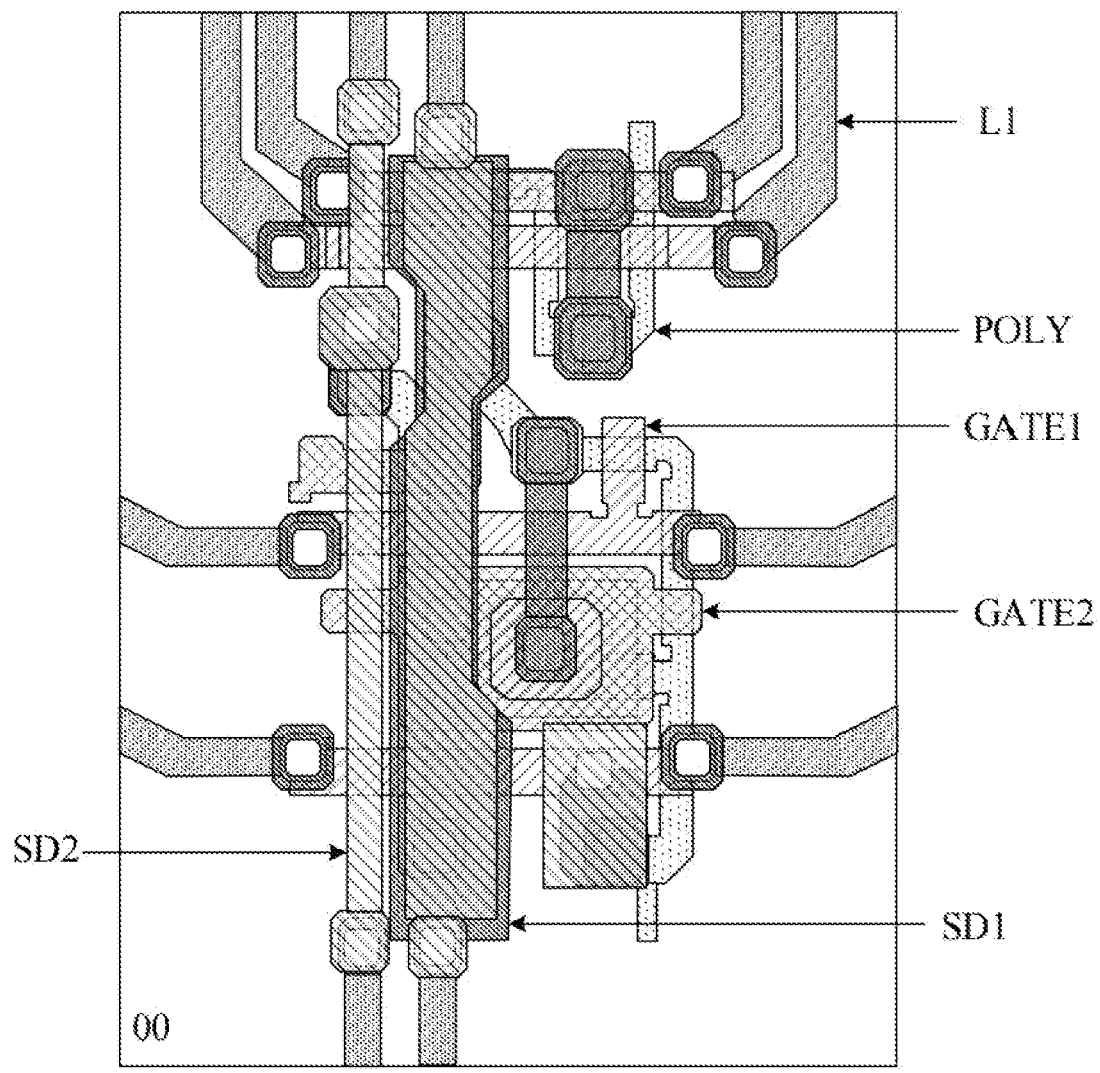
FIG. 23 a structural layout of a display substrate including a transistor pattern layer, a first gate metal layer, a second gate metal layer, a via hole, a first source-drain metal layer, a transparent conductive line, and a second source-drain metal layer according to an embodiment of the present disclosure.

For example, FIG. 23 shows a schematic structural diagram of the base substrate 00 with the second source-drain metal layer SD2 formed on the via hole K1.

In step 14011, a second planarization layer is formed on a side of the second source-drain metal layer distal from the first planarization layer.

Optionally, after the second source-drain metal layer is formed, the second planarization layer may be continuously formed on the side of the second source-drain metal layer distal from the first planarization layer. Further, after the second planarization layer is formed, the second planarization layer may be processed to acquire a plurality of connection via holes.

Figure 24:
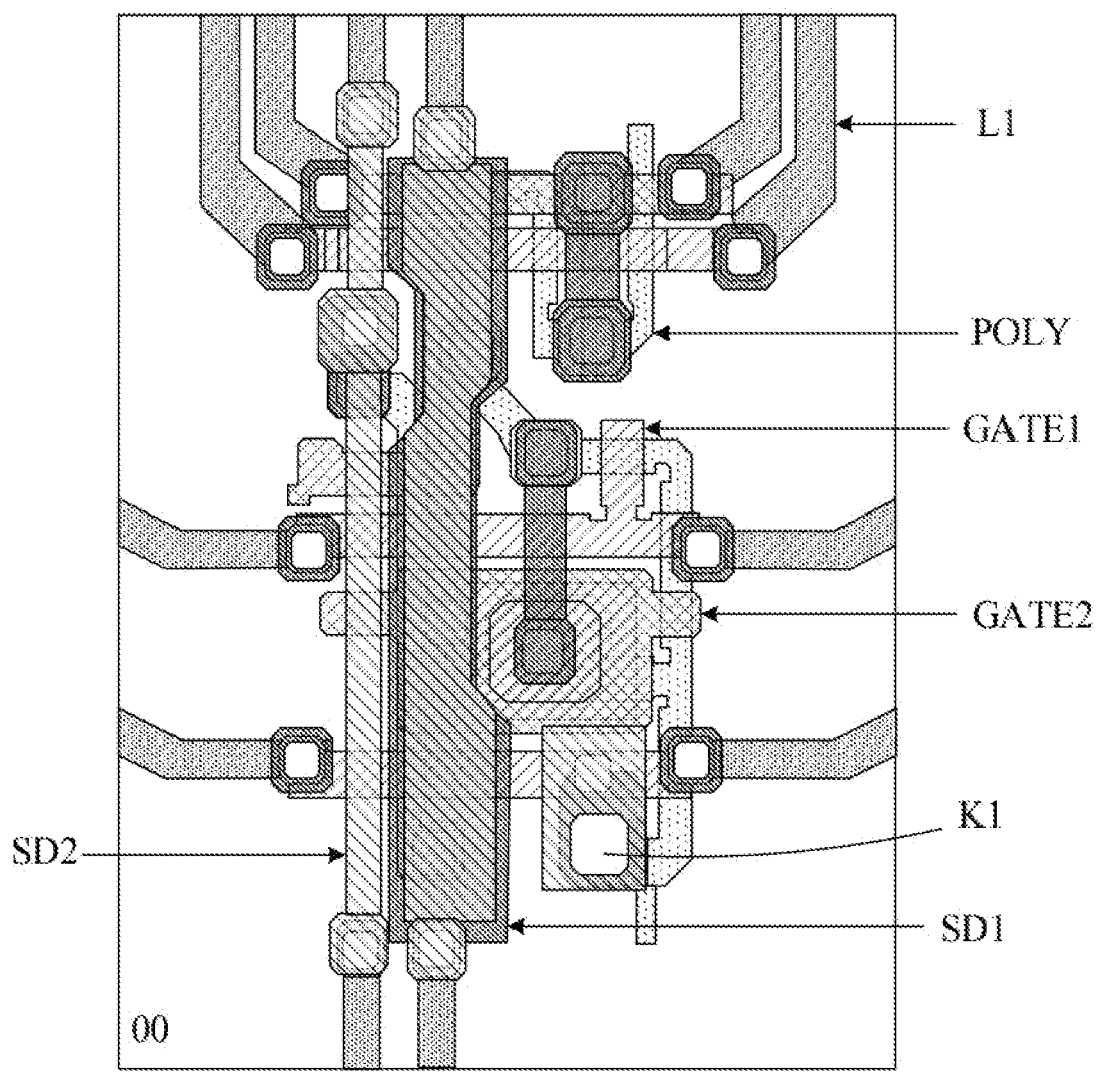
FIG. 24 is a structural layout of another display substrate including a transistor pattern layer, a first gate metal layer, a second gate metal layer, a via hole, a first source-drain metal layer, a transparent conductive line, and a second source-drain metal layer according to an embodiment of the present disclosure.

For example, FIG. 24 shows a schematic structural diagram of the base substrate 00 with the via hole K1 formed on the second source-drain metal layer SD2.

In step 14012, an anode is formed on a side of the second planarization layer distal from the second source-drain metal layer.

Optionally, after the second planarization layer is formed, the anode may be continuously formed on the side of the second planarization layer distal from the second source-drain metal layer.

Figure 25:
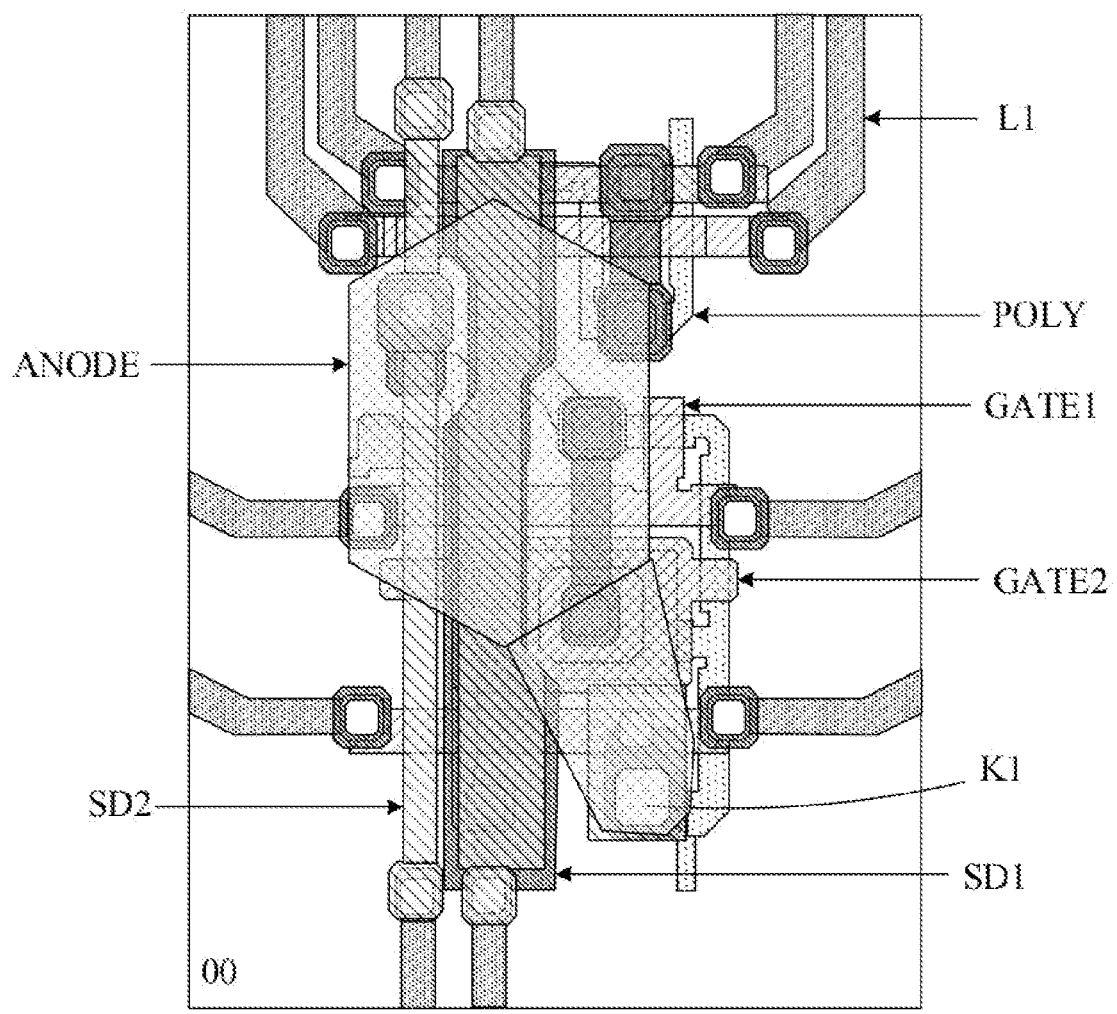
FIG. 25 is a structural layout of a display substrate including a transistor pattern layer, a first gate metal layer, a second gate metal layer, a via hole, a first source-drain metal layer, a transparent conductive line, a second source-drain metal layer, and an anode according to an embodiment of the present disclosure.

For example, FIG. 25 shows a schematic structural diagram of the base substrate 00 with the anode ANODE formed on the via hole K1. Moreover, the anode ANODE may be connected to the second source-drain metal layer SD2 through the via hole K1.

That is, based on FIGS. 14 to 25, it can be determined that the sequence of the process for manufacturing the display substrate according to the embodiments of the present disclosure is: POLY-GATE1-GATE2-ILD-SD1-PVX-ITO-PLN1-SD2-PLN2-ANODE.

It should be noted that, for each hierarchical structure, the same layer with the same number and filled with the same color is identified in FIGS. 15 to 25, respectively.

It should also be noted that referring to FIG. 6, insulating layers are disposed between the transistor pattern layer 106 and the first gate metal layer GATE1, and between the first gate metal layer GATE1 and the second gate metal layer GATE2, such that before step 1403 is performed, the step of first forming an insulating layer on the side of the transistor pattern layer distal from the base substrate may also be included. Further, before step 1404 is performed, a step of first forming an insulating layer on the side of the first gate metal layer distal from the transistor pattern layer may also be included.

In summary, the embodiments of the present disclosure disclose a method for manufacturing a display substrate. In this method, the transparent conductive line is formed after forming the passivation layer and before forming the first planarization layer. Since the passivation layer and the first planarization layer are two existing insulating layers, compared to forming the transparent conductive line at other positions, the method according to embodiments of the present disclosure not only ensures that the light transmittance of the second display region is better, but also the structure of the manufactured display substrate is relatively simple, and the manufacturing cost is relatively low.

Figure 26:
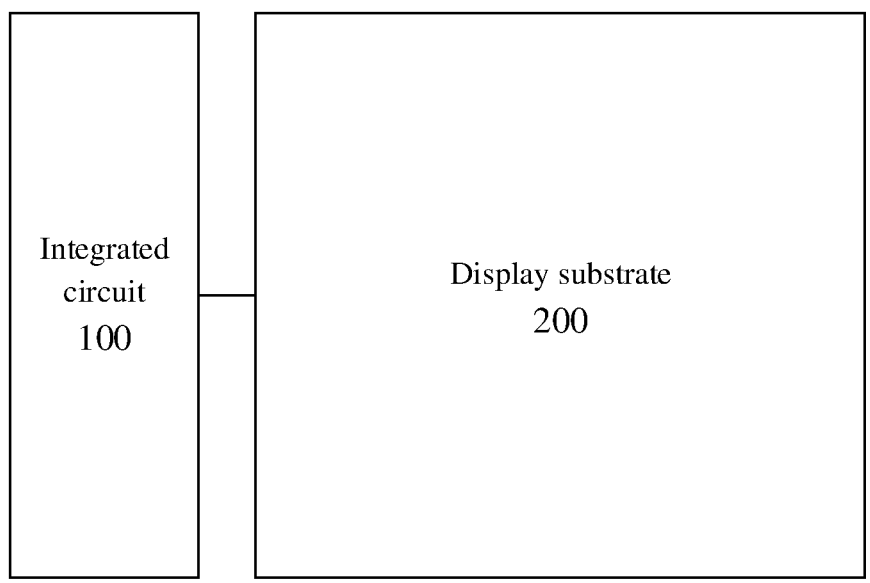
FIG. 26 is a schematic structural diagram of a display device according to an embodiment of the present disclosure.

Optionally, FIG. 26 is a schematic structural diagram of a display device according to an embodiment of the present disclosure. As shown in FIG. 26, the display device may include an integrated circuit 100, and a display substrate 200 as shown in any of FIGS. 1 to 3, 7, 8, and 12.

Referring to the above drawings, it can be seen that the integrated circuit 100 may be electrically connected to the transparent conductive line L1 included in the pixel circuit 10 in the display substrate 200, and the integrated circuit 100 may be configured to provide a signal to the transparent conductive line L1.

Exemplarily, referring to FIG. 7, the integrated circuit 100 may be electrically connected to the signal terminal connected to each transparent conductive line L1, and provide a signal to each signal terminal, to indirectly provide a signal to the transparent conductive line L1.

It should be noted that FIG. 26 only schematically shows the position of the integrated circuit 100. The integrated circuit 100 may be disposed on the right side of the display substrate 200. Alternatively, the integrated circuits 100 may be disposed on both the left and right sides of the display substrate 200. Alternatively, the integrated circuit(s) 100 may be disposed on the upper side and/or the lower side of the display substrate 200.

Optionally, the display device may be any product or component with a display function, such as an active-matrix organic light-emitting diode (AMOLED) display device, a liquid crystal display device, a mobile phone, a computer, a television, a monitor, an electronic paper, a digital photo frame, or a navigator.

It should be understood that "and/or" mentioned herein means that there can be three relationships, for example, A and/or B can mean that A exists alone, A and B exist at the same time, B exists alone. The character "/" generally indicates that the associated objects before and after being in an "or" relationship.

Described above are merely exemplary embodiments of the present disclosure, and are not intended to limit the present disclosure. Within the spirit and principles of the disclosure, any modifications, equivalent substitutions, improvements, and the like are within the protection scope of the present disclosure.

The invention claimed is:

1. A display substrate, comprising:
 a base substrate having a first display region and a second display region, wherein the first display region is at least partially disposed around the second display region, and the second display region is a light-transmitting display region; and
 a plurality of pixels, disposed in the second display region, each of the plurality of pixels comprising a pixel circuit and a target electrode connected to each other, wherein an orthographic projection of the pixel circuit on the base substrate is at least partially overlapped with an orthographic projection of the target electrode on the base substrate, two adjacent pixels are connected by at least one transparent conductive line, and the pixel circuit comprises a transistor pattern layer, a first gate metal layer, a second gate metal layer, a first source-drain metal layer, and a second source-drain metal layer which are disposed on a side of the base substrate and sequentially stacked, the at least one transparent conductive line being disposed between the first source-drain metal layer and the second source-drain metal layer.

2. The display substrate according to claim 1, wherein the plurality of pixels comprise a plurality of pixel rows and a plurality of pixel columns, with two adjacent pixel rows arranged in a staggered manner in a column direction and two adjacent pixel columns arranged in a staggered manner in a row direction.

3. The display substrate according to claim 1, wherein each of the at least one transparent conductive line is connected to one of the first gate metal layer, the second gate metal layer, the first source-drain metal layer, and a second source-drain metal layer.

4. The display substrate according to claim 1, wherein the pixel circuit comprises a first insulating layer and a second insulating layer, wherein the first insulating layer is disposed between the first source-drain metal layer and the at least one transparent conductive line, and the second insulating layer is disposed between the at least one transparent conductive line and the second source-drain metal layer.

5. The display substrate according to claim 4, wherein the first insulating layer is a passivation layer, and the second insulating layer is a first planarization layer.

6. The display substrate according to claim 1, wherein a material of each of the at least one transparent conductive line is indium tin oxide.

7. The display substrate according to claim 1, wherein the target electrode is an anode.

8. The display substrate according to claim 1, wherein the at least one transparent conductive line comprises a first transparent conductive line;

wherein the first transparent conductive line is connected to the first source-drain metal layer and is configured to transmit a power signal, and the first transparent conductive lines in two adjacent pixel circuits disposed in a same column are integrally formed.

9. The display substrate according to claim 1, wherein the at least one transparent conductive line comprises a second transparent conductive line;
wherein the second transparent conductive line is connected to the second source-drain metal layer and is configured to transmit a data signal, and the second transparent conductive lines in two adjacent pixel circuits disposed in a same column are integrally formed.

10. The display substrate according to claim 1, wherein the pixel circuit further comprises a third insulating layer and a fourth insulating layer, wherein the third insulating layer is disposed on a side of the second source-drain metal layer distal from the base substrate, and the fourth insulating layer is disposed between the second gate metal layer and the first source-drain metal layer.

11. The display substrate according to claim 10, wherein the third insulating layer is a second planarization layer, and the fourth insulating layer is an interlayer dielectric layer.

12. The display substrate according to claim 10, wherein the first gate metal layer comprises a first portion, a second portion, and a third portion; the at least one transparent conductive line comprises a third transparent conductive line, a fourth transparent conductive line, and a fifth transparent conductive line; wherein
the third transparent conductive line is connected to the first portion and is configured to transmit a light emission control signal, and the third transparent conductive lines in two adjacent pixel circuits disposed in a same row are integrally formed;
the fourth transparent conductive line is connected to the second portion and is configured to transmit a gate driving signal, and the fourth transparent conductive lines in two adjacent pixel circuits disposed in a same row are integrally formed; and
the fifth transparent conductive line is connected to the third portion and is configured to transmit a reset signal, and the fifth transparent conductive lines in two adjacent pixel circuits disposed in a same row are integrally formed.

13. The display substrate according to claim 12, wherein the at least one transparent conductive line comprises a sixth transparent conductive line;
wherein the sixth transparent conductive line is connected to the second gate metal layer and is configured to transmit an initial signal, and the sixth transparent conductive lines in two adjacent pixel circuits disposed in a same row are integrally formed.

14. The display substrate according to claim 1, wherein a resolution of the first display region is greater than or equal to a resolution of the second display region.

15. The display substrate according to claim 1, wherein each of the at least one transparent conductive line is connected to one metal layer in the pixel circuit through a via hole.

16. The display substrate according to claim 12, wherein a material of each of the at least one transparent conductive line is indium tin oxide; and the target electrode is an anode; and
the at least one transparent conductive line comprises a first transparent conductive line, a second transparent conductive line, and a sixth transparent conductive line; wherein the first transparent conductive line is connected to the first source-drain metal layer and is configured to transmit a power signal, and the first transparent conductive lines in two adjacent pixel circuits disposed in a same column are integrally formed; the second transparent conductive line is connected to the second source-drain metal layer and is configured to transmit a data signal, and the second transparent conductive lines in two adjacent pixel circuits disposed in the same column are integrally formed; the sixth transparent conductive line is connected to the second gate metal layer and is configured to transmit an initial signal, and the sixth transparent conductive lines in two adjacent pixel circuits disposed in a same row are integrally formed; the second display region is a light-transmitting display region; a resolution of the first display region is greater than or equal to a resolution of the second display region; and each of the at least one transparent conductive line is connected to one metal layer in the pixel circuit through a via hole.

17. A method for manufacturing a display substrate, comprising:
providing a base substrate, wherein the base substrate has a first display region and a second display region, the first display region being at least partially disposed around the second display region, and the second display region being a light-transmitting display region;
forming a plurality of pixels on a side of the base substrate, wherein each of the pixels comprises a pixel circuit and a target electrode connected to each other;
wherein the pixel circuit is disposed in the second display region, an orthographic projection of the pixel circuit on the base substrate is at least partially overlapped with an orthographic projection of the target electrode on the base substrate, two adjacent pixels are connected by at least one transparent conductive line, and the pixel circuit comprises a transistor pattern layer, a first gate metal layer, a second gate metal layer, a first source-drain metal layer, and a second source-drain metal layer which are disposed on a side of the base substrate and sequentially stacked, the at least one transparent conductive line being disposed between the first source-drain metal layer and the second source-drain metal layer.

18. A display device, wherein the display device comprises an integrated circuit and a display substrate;
wherein the display substrate comprises a base substrate and a plurality of pixels, wherein the base substrate has a first display region and a second display region, wherein the first display region is at least partially disposed around the second display region, and the second display region is a light-transmitting display region; and the plurality of pixels are disposed in the second display region, each of the plurality of pixels comprising a pixel circuit and a target electrode connected to each other, wherein an orthographic projection of the pixel circuit on the base substrate is at least partially overlapped with an orthographic projection of the target electrode on the base substrate, two adjacent pixels are connected by at least one transparent conductive line, and the pixel circuit comprises a transistor pattern layer, a first gate metal layer, a second gate metal layer, a first source-drain metal layer, and a second source-drain metal layer which are disposed on a side of the base substrate and sequentially stacked, the at least one transparent conductive line being disposed between the first source-drain metal layer and the second source-drain metal layer;

the integrated circuit is electrically connected to a transparent conductive line in a pixel circuit in the display substrate, and the integrated circuit is configured to provide a signal to the transparent conductive line.

19. The display device according to claim 18, wherein the display device further comprises a photosensitive sensor, wherein the photosensitive sensor is disposed in the second display region of the display substrate.

20. The display device according to claim 19, wherein the second display region is rectangular, and an area of an orthographic projection of the photosensitive sensor on the base substrate is less than or equal to an area of an inscribed circle of the second display region.

* * * * *